United States Patent
Yanagigawa

(10) Patent No.: US 10,250,255 B2
(45) Date of Patent: Apr. 2, 2019

(54) SEMICONDUCTOR DEVICE AND CIRCUIT ARRANGEMENT USING THE SAME

(71) Applicant: Renesas Electronics Corporation, Tokyo (JP)

(72) Inventor: Hiroshi Yanagigawa, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 251 days.

(21) Appl. No.: 15/091,827

(22) Filed: Apr. 6, 2016

(65) Prior Publication Data

US 2016/0308529 A1    Oct. 20, 2016

(30) Foreign Application Priority Data

Apr. 16, 2015    (JP) .................. 2015-084251

(51) Int. Cl.
| | | |
|---|---|---|
| *H03K 17/687* | (2006.01) | |
| *H01L 21/8234* | (2006.01) | |
| *H01L 27/02* | (2006.01) | |
| *H01L 29/78* | (2006.01) | |
| *H01L 27/088* | (2006.01) | |
| *H01L 29/06* | (2006.01) | |
| *H01L 29/36* | (2006.01) | |
| *H03K 17/06* | (2006.01) | |

(52) U.S. Cl.
CPC . *H03K 17/6871* (2013.01); *H01L 21/823487* (2013.01); *H01L 27/0266* (2013.01); *H01L 27/088* (2013.01); *H01L 29/0634* (2013.01); *H01L 29/36* (2013.01); *H01L 29/7813* (2013.01); *H03K 17/6874* (2013.01); *H03K 17/06* (2013.01)

(58) Field of Classification Search
CPC ..................... H03K 17/687; H03K 17/6871
See application file for complete search history.

(56) References Cited

U.S. PATENT DOCUMENTS

| | | |
|---|---|---|
| 5,126,911 A | 6/1992 | Contiero et al. |
| 7,772,704 B2 | 8/2010 | Yoshida et al. |
| 8,008,717 B2 | 8/2011 | Kawashima |
| 9,006,823 B2 | 4/2015 | Yamazaki |

(Continued)

FOREIGN PATENT DOCUMENTS

| | | |
|---|---|---|
| EP | 0717497 A2 | 6/1996 |
| JP | H2-122665 A | 5/1990 |

(Continued)

OTHER PUBLICATIONS

Communication dated Sep. 9, 2016 from the European Patent Office in counterpart application No. 16164495.0.

(Continued)

*Primary Examiner* — Hai L Nguyen
(74) *Attorney, Agent, or Firm* — Sughrue Mion, PLLC

(57) ABSTRACT

A semiconductor device and a circuit arrangement are provided so as to reduce an on resistance. A first power MOS transistor and a second power MOS transistor are formed on the same semiconductor substrate. A first power MOS transistor formed in a first element formation region has a columnless structure including no columns. The second power MOS transistor formed in a second element formation region has an SJ structure including columns.

9 Claims, 33 Drawing Sheets

(56) References Cited

U.S. PATENT DOCUMENTS

| | | | |
|---|---|---|---|
| 9,793,265 B2* | 10/2017 | Shiraishi | ............. H01L 23/3107 |
| 2006/0157813 A1 | 7/2006 | Saito et al. | |
| 2006/0214221 A1 | 9/2006 | Challa et al. | |
| 2014/0231912 A1 | 8/2014 | Willmeroth et al. | |

FOREIGN PATENT DOCUMENTS

| | | |
|---|---|---|
| JP | 2002-368219 A | 12/2002 |
| JP | 2008-53623 A | 3/2008 |
| JP | 2010-16309 A | 1/2010 |
| JP | 2011-258686 A | 12/2011 |
| JP | 2014-150113 A | 8/2014 |

OTHER PUBLICATIONS

Communication dated Aug. 28, 2018 issued by the Japanese Patent Office in counterpart application No. 2015-084251.

* cited by examiner

SEMICONDUCTOR DEVICE AND CIRCUIT ARRANGEMENT USING THE SAME

CROSS-REFERENCE TO RELATED APPLICATIONS

The disclosure of Japanese Patent Application No. 2015-084251 filed on Apr. 16, 2015 including the specification, drawings and abstract is incorporated herein by reference in its entirety.

BACKGROUND

The present invention relates to a semiconductor device and a circuit arrangement using the same and is suitably used for, in particular, a vehicle-mounted semiconductor device including a power semiconductor device.

Automobiles include electrical components such as a headlight and a power window. In related art, relays have been used as switches for supplying and interrupting power to these components from batteries. In recent years, such relays have been replaced with semiconductor devices having power MOS (Metal Oxide Semiconductor) transistors.

In battery maintenance including inspection and replacement, a cable coupled to a battery may be removed. After the maintenance, the removed cable is coupled to the battery. At this point, the cable may be coupled opposite to (reversely coupled) the cathode and anode of the battery.

If the cable is reversely coupled to the battery, a switch with a relay inevitably interrupts current when being turned off. However, even if a switch with a semiconductor device is turned off, the switch allows passage of current through a parasitic diode included in a power MOS transistor. In other words, current flows backward with the switch turned off.

A semiconductor device with two power MOS transistors is proposed to prevent the backflow of current. The two power MOS transistors are coupled in series with the coupled drains. The two power MOS transistors are power MOS transistors having identical properties such as a withstand voltage set relative to a battery voltage in view of a load dump surge.

Japanese Unexamined Patent Application Publication No. 2002-368219 discloses a semiconductor device that controls charging and discharging of a battery using two power MOS transistors.

SUMMARY

A semiconductor device of related art includes two power MOS transistors having identical properties. This may substantially double an on resistance and thus the semiconductor device acting as a switch needs to reduce the on resistance.

Other problems and new features will become apparent from a description of the specification and the accompanying drawings.

A semiconductor device according to an embodiment includes a semiconductor substrate of a first conductivity type, an epitaxial layer of the first conductivity type, first and second regions, a first switching element, and a second switching element. The first switching element includes a first electrode, a first-impurity-region first part of a second conductivity type, and a second-impurity-region first part of the first conductivity type. The second switching element includes a second electrode, a first-impurity-region second part of the second conductivity type, a second-impurity-region second part of the first conductivity type, and columns of the second conductivity type.

A semiconductor device according to another embodiment includes a semiconductor substrate of a first conductivity type, an epitaxial layer of the first conductivity type, first and second regions, a first switching element, and a second switching element. The first switching element includes a first electrode, a first-impurity-region first part of a second conductivity type, and first columns of the second conductivity type. The second switching element includes a second electrode, a first-impurity-region second part of the second conductivity type, a second-impurity-region second part of the first conductivity type, and second columns of the second conductivity type. The first columns are shorter than the second columns.

A circuit arrangement according to still another embodiment includes a first switching element and a second switching element that are coupled in series. The first switching element has a columnless structure having no columns on a current path. The second switching element has a superjunction structure including columns on the current path.

The semiconductor device according to the embodiment can reduce the on resistance of the semiconductor device acting as a switch.

The semiconductor device according to another embodiment can reduce the on resistance of the semiconductor device acting as a switch.

The semiconductor device according to still another embodiment can reduce the on resistances of the first and second switching elements coupled in series.

DETAILED DESCRIPTION

Figure 1:
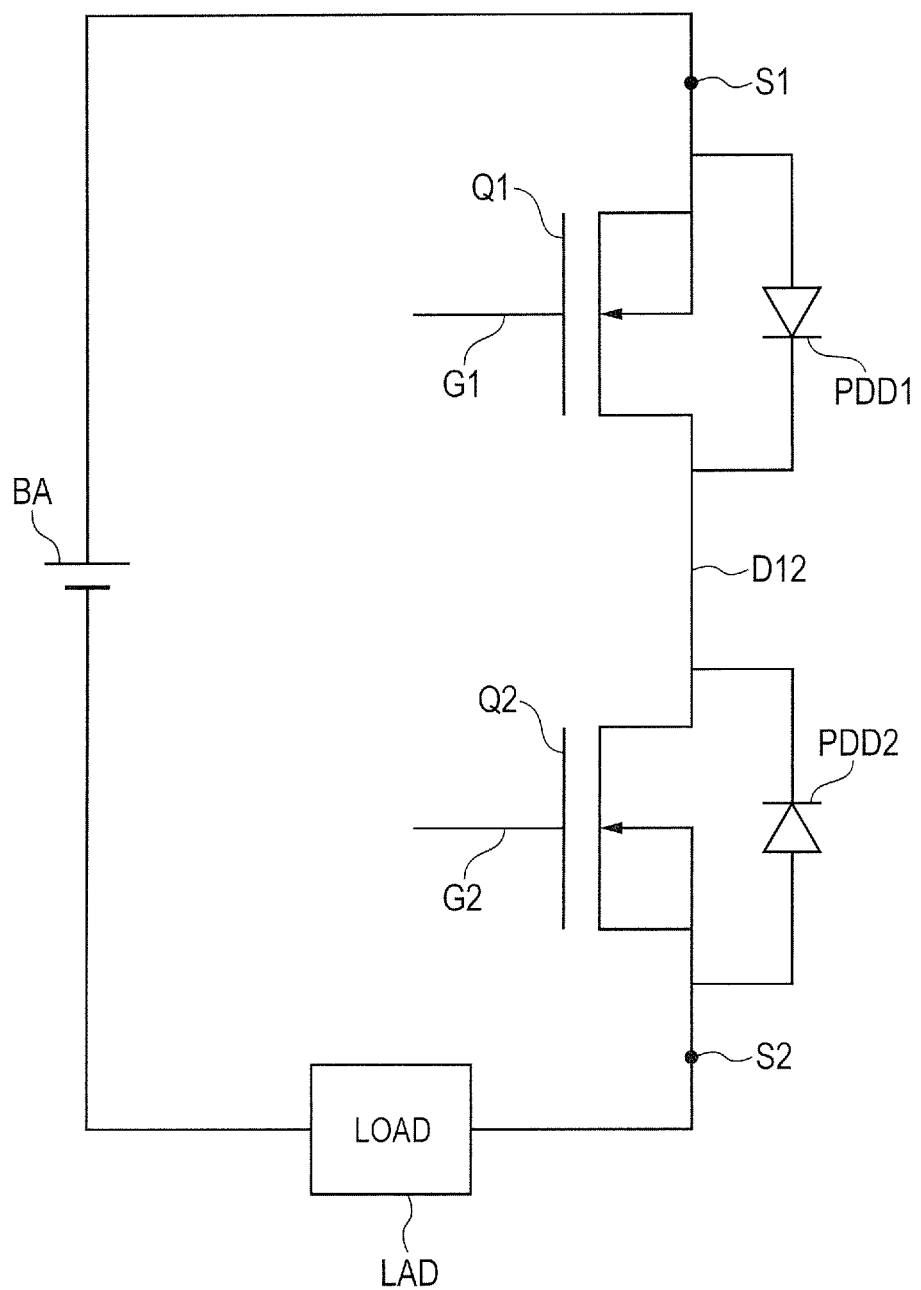
FIG. 1 is a circuit diagram containing a semiconductor device acting as a switch according to embodiments.

A circuit (circuit arrangement) including a semiconductor device according to embodiments will be described below. As shown in FIG. 1, a first power MOS transistor Q1 (first switching element) and a second power MOS transistor Q2 (second switching element) are electrically coupled in series via a common drain D12 in a circuit including a semiconductor device acting as a switch, a battery BA, and a load LAD. The cathode of the battery BA is electrically coupled to a source S1 of the first power MOS transistor while the anode of the battery BA is electrically coupled to a source S2 of the second power MOS transistor (appropriate coupling). The load LAD of a headlight or the like is electrically coupled between the source S2 and the battery BA.

The second power MOS transistor Q2 is a power MOS transistor that performs normal operations (on and off) for supplying power to the load LAD in the appropriate coupling of the battery BA and has a withstand voltage set in view of a load dump surge. The first power MOS transistor Q1 is a power MOS transistor that prevents backflow of current in the case of the reverse coupling of the battery.

Figure 2:
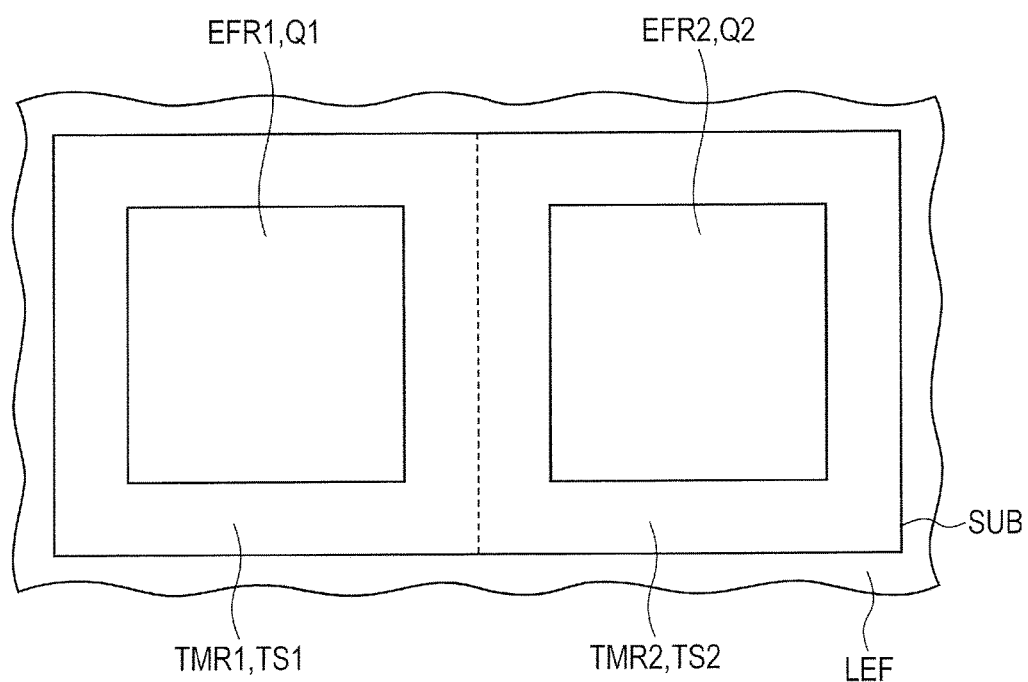
FIG. 2 shows a plane pattern of the semiconductor device according to the embodiments.

As shown in FIG. 2, the first power MOS transistor Q1 and the second power MOS transistor Q2 are formed on the same semiconductor substrate SUB. The first power MOS transistor Q1 is formed in a first element formation region EFR1 and the second power MOS transistor Q2 is formed in a second element formation region EFR2. The semiconductor substrate SUB is mounted on, for example, a lead frame LEF.

The first element formation region EFR1 is surrounded by a first outer region TMR1 and the second element formation region EFR2 is surrounded by a second outer region TMR2. The first outer region TMR1 and the second outer region TMR2 has a first outer structure TS1 and a second outer structure TS2, respectively, that prevent leakage of current.

In the semiconductor device acting as a switch, the two power MOS transistors are: a power MOS transistor having a super junction structure (SJ structure) including columns and a power MOS transistor having a columnless structure. The MOS transistors are combined depending on the specifications. The semiconductor device will be specifically described below according to the embodiments.

First Embodiment

A semiconductor device used for a 12V-battery will be discussed below. The semiconductor device includes two power MOS transistors: a power MOS transistor having an SJ structure and a power MOS transistor having a columnless structure.

Figure 3:
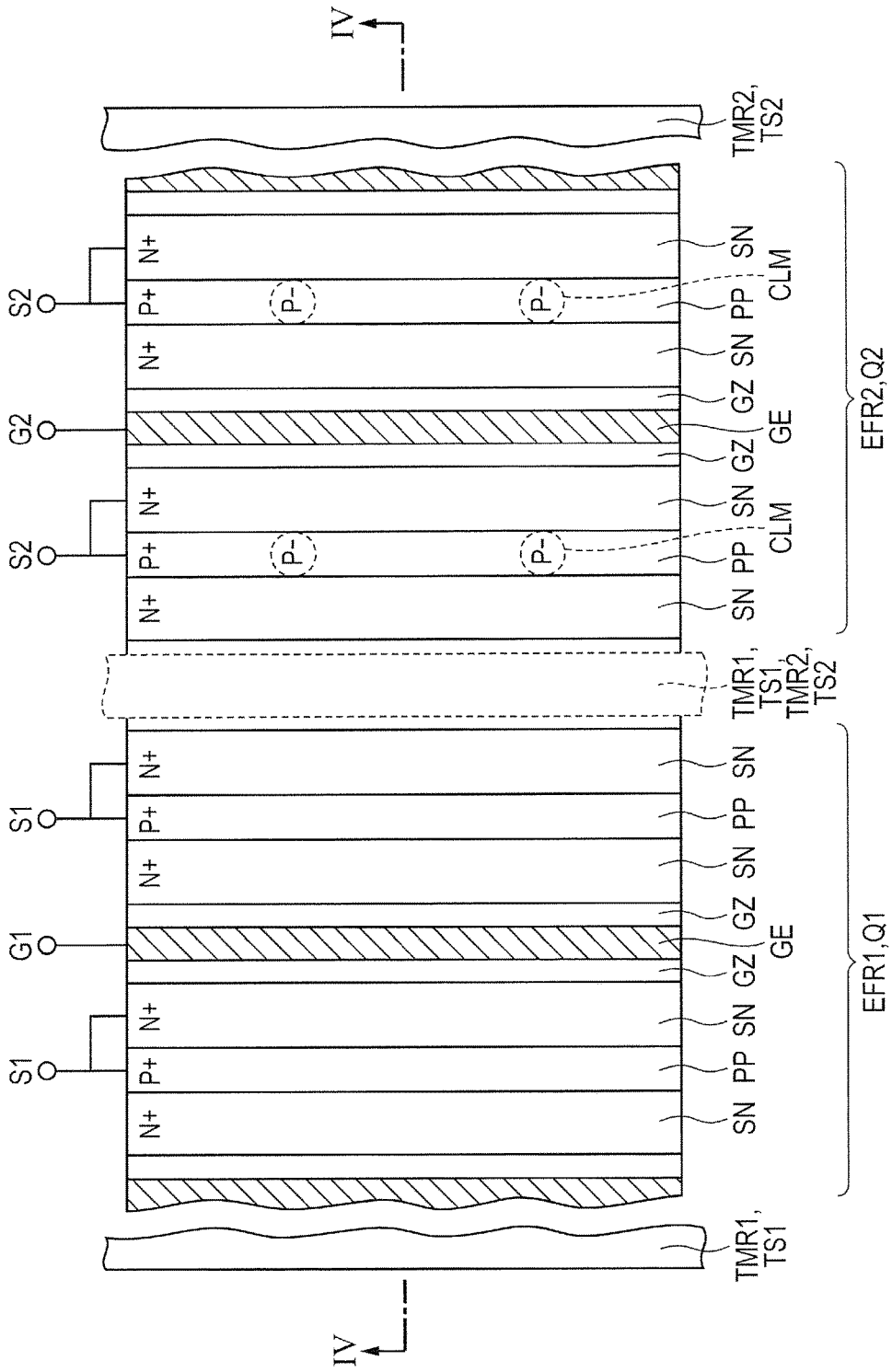
FIG. 3 is a partial plan view showing the planar structure of the semiconductor device according to the first embodiment.
Figure 4:
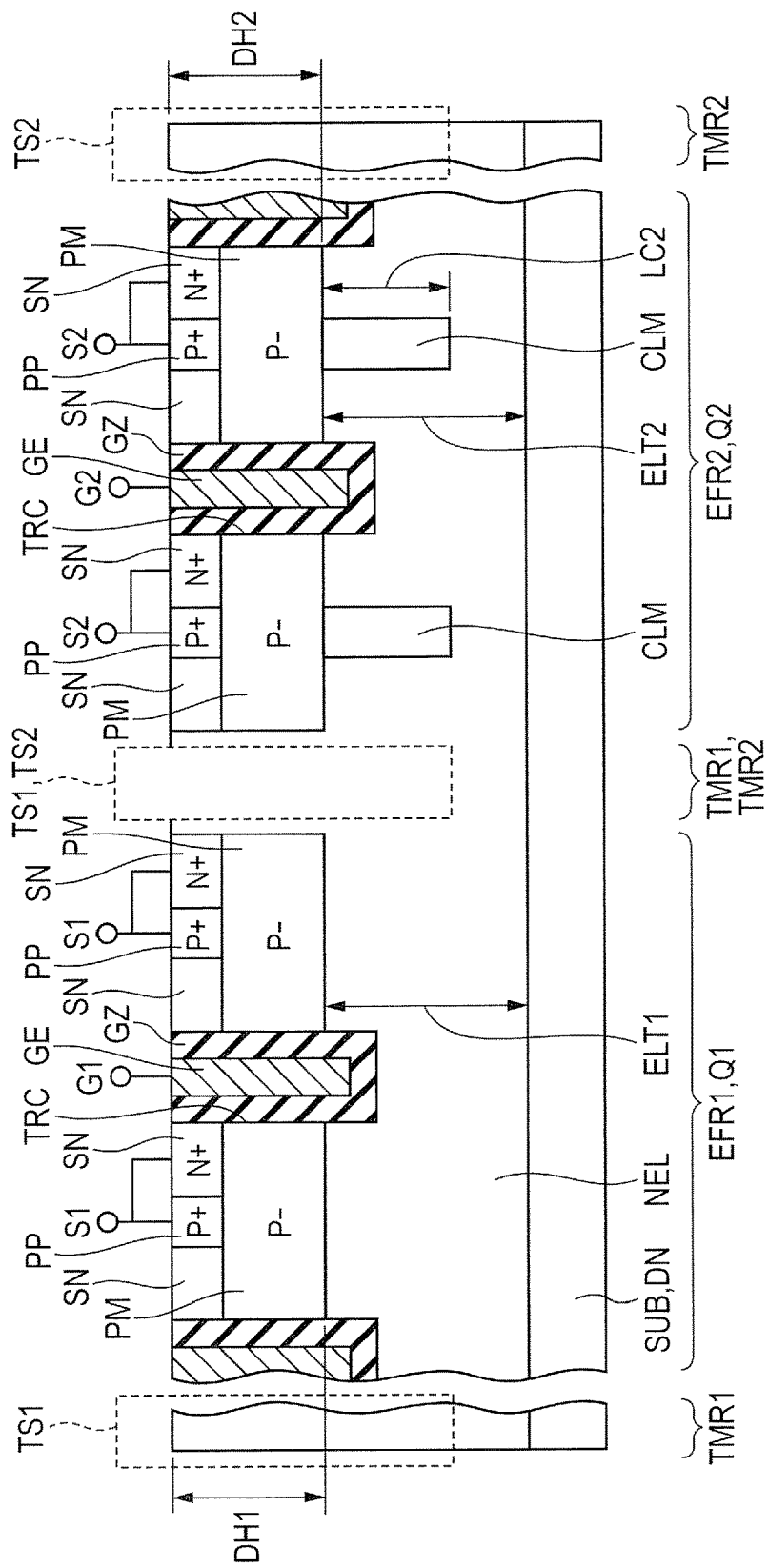
FIG. 4 is a partial cross-sectional view taken along line IV-IV of FIG. 3 according to the first embodiment.

As shown in FIGS. 3 and 4, an N-type epitaxial layer NEL is formed on the surface of the N-type semiconductor substrate SUB serving as a common drain region. On the epitaxial layer NEL, the first element formation region EFR1 and the second element formation region EFR2 are located with a certain distance. The epitaxial layer NEL in the first element formation region EFR1 has a thickness ELT1, about 2 µm, as large as a thickness ELT2 of the epitaxial layer NEL in the second element formation region EFR2. The original thickness of the N-type epitaxial layer NEL is about 5 to 6 µm.

The first element formation region EFR1 includes the first power MOS transistor Q1 having the columnless structure and the second element formation region EFR2 includes the second power MOS transistor Q2 having the SJ structure.

The first element formation region EFR1 has a trench TRC containing a gate electrode GE (gate G1, first electrode) formed via a gate insulating film GZ (first insulating film). A P− region PM (first-impurity-region first part) in contact with the gate insulating film GZ is formed at a smaller depth (depth DH1) than the bottom of the trench TRC in the epitaxial layer NEL. An N+ region SN (second-impurity-region first part) serving as a source region (source S1) and a P+ region PP are formed in contact with the P− region PM, at a smaller depth than the P− region PM in the epitaxial layer NEL.

The second element formation region EFR2 has a trench TRC containing a gate electrode GE (gate G2, second electrode) formed via a gate insulating film GZ (second insulating film). A P− region PM (first-impurity-region second part) in contact with the gate insulating film GZ is formed at a smaller depth (depth DH2) than the bottom of the trench TRC in the epitaxial layer NEL. In the semiconductor device, the depth DH1 and the depth DH2 are equal to each other.

An N+ region SN (second-impurity-region second part) serving as a source region (source S2) and a P+ region PP are formed in contact with the P− region PM, at a smaller depth than the P− region PM in the epitaxial layer NEL. Furthermore, a column CLM in contact with the P− region PM is extended toward the semiconductor substrate SUB. The column CLM has a length LC2 of, for example, about 1.5 µm.

The gate electrodes GE (trenches TRC) are extended in one direction and are spaced substantially perpendicularly to the one direction. The N+ regions SN and the P+ regions PP are arranged like stripes along the gate electrodes GE. The columns CLM arranged along the extending direction of the gate electrode GE are spaced from one another.

If the battery has a voltage of 12 V, the power MOS transistor needs to have a withstand voltage of about 40 V in view of a load dump surge. In the case of reverse coupling of the battery, the power MOS transistor only needs to have a withstand voltage of about 16 V that is slightly higher than the voltage of the battery. In the semiconductor device, the second power MOS transistor Q2 having the SJ structure obtains a withstand voltage of about 40 V and the first power MOS transistor Q1 having the columnless structure obtains a withstand voltage of about 16 V.

Figure 5:
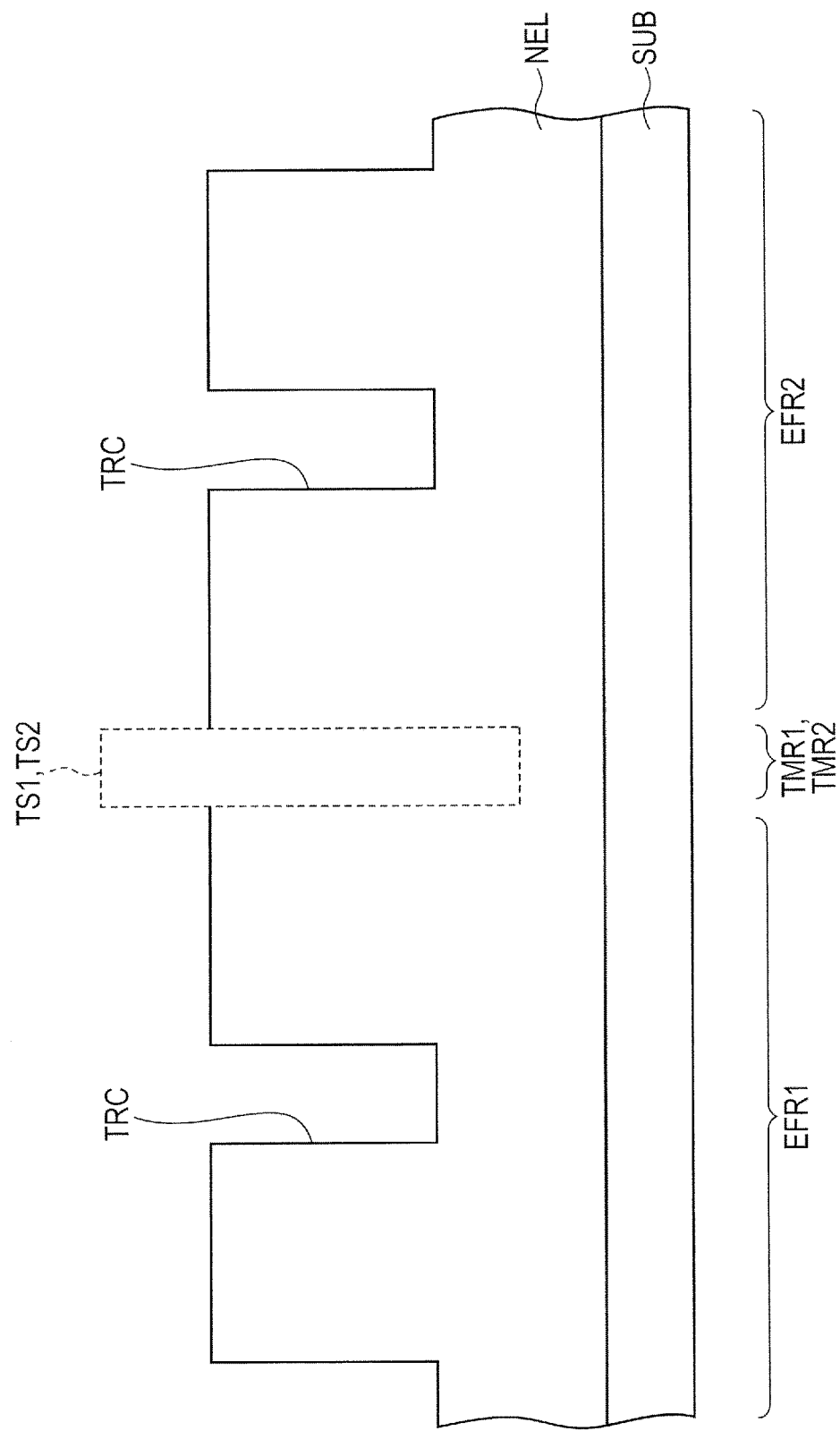
FIG. 5 is a partial cross-sectional view showing one step of the manufacturing method of the semiconductor device according to the first embodiment.

An example of a method of manufacturing the semiconductor device will be described below. First, the N-type semiconductor substrate SUB is prepared as a drain region (FIG. 5). Subsequently, as shown in FIG. 5, the N-type epitaxial layer NEL having a thickness of about 5 to 6 nm is formed on the surface of the semiconductor substrate SUB by epitaxial growth. The epitaxial layer NEL is then subjected to photoengraving and etching, forming the trenches TRC extending in one direction with a predetermined depth.

Figure 6:
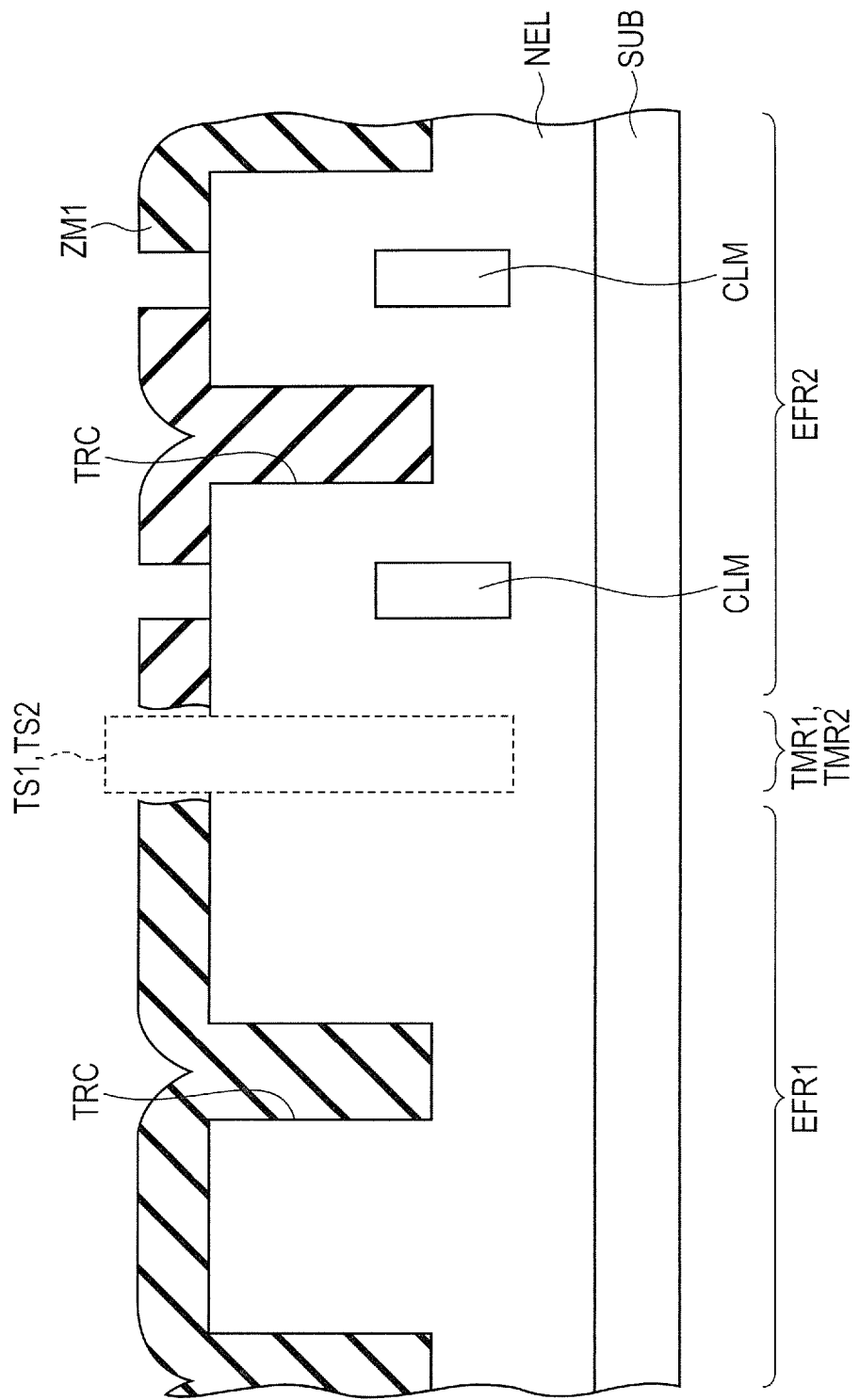
FIG. 6 is a partial cross-sectional view showing a step performed after the step of FIG. 5 according to the first embodiment.

Subsequently, an insulating film (not shown), e.g., a silicon oxide film serving as a mask member is formed over the epitaxial layer NEL. The insulating film is then subjected to photoengraving and etching so as to form an insulating film ZM1 that has openings for exposing column portions in the second element formation region EFR2 as shown in FIG. 6. Subsequently, a P-type impurity is injected with the insulating film ZM1 serving as an injection mask, forming the P-type columns CLM extending toward to the semiconductor substrate SUB. After that, the insulating film ZM1 is removed.

Figure 7:
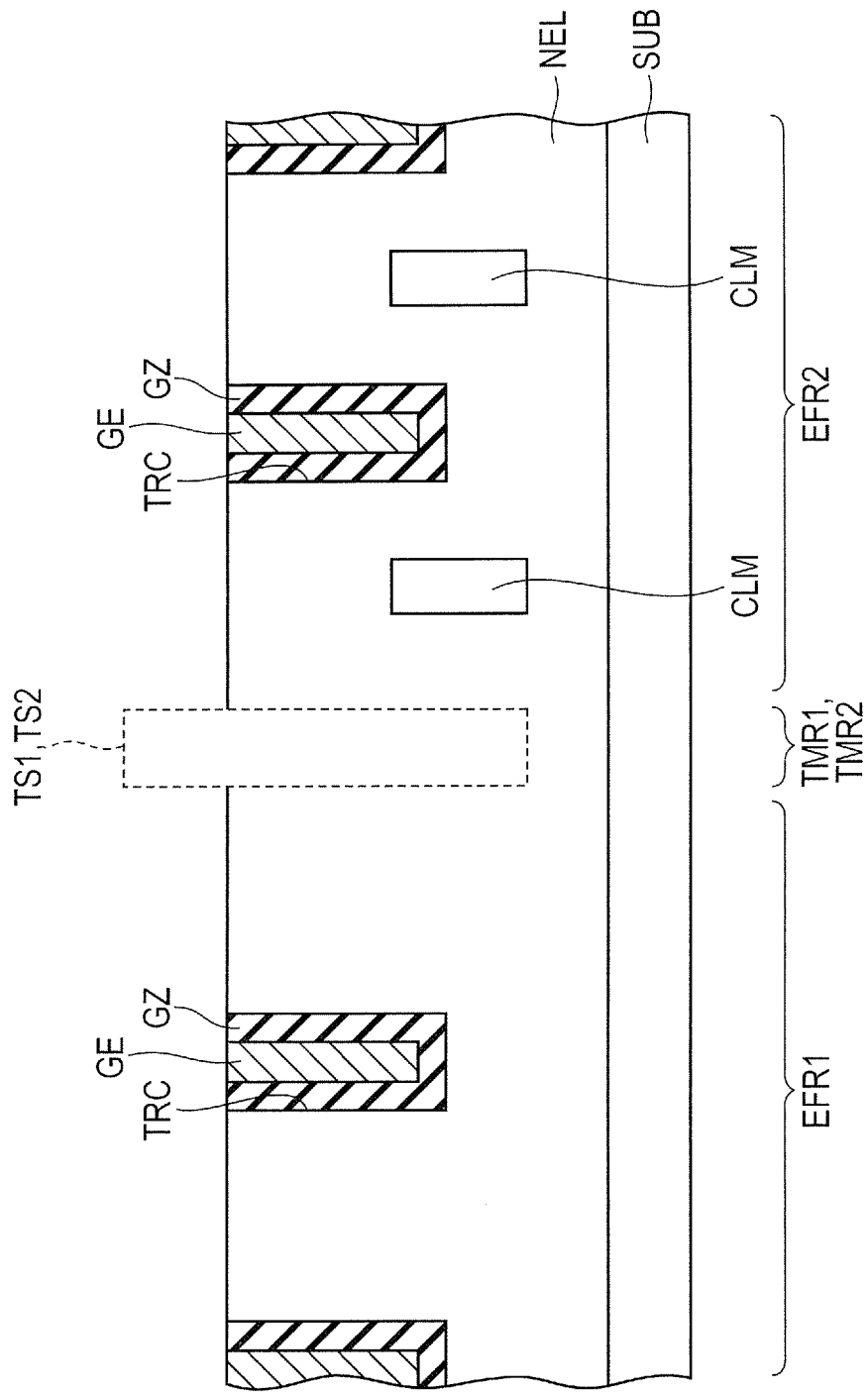
FIG. 7 is a partial cross-sectional view showing a step performed after the step of FIG. 6 according to the first embodiment.
Figure 8:
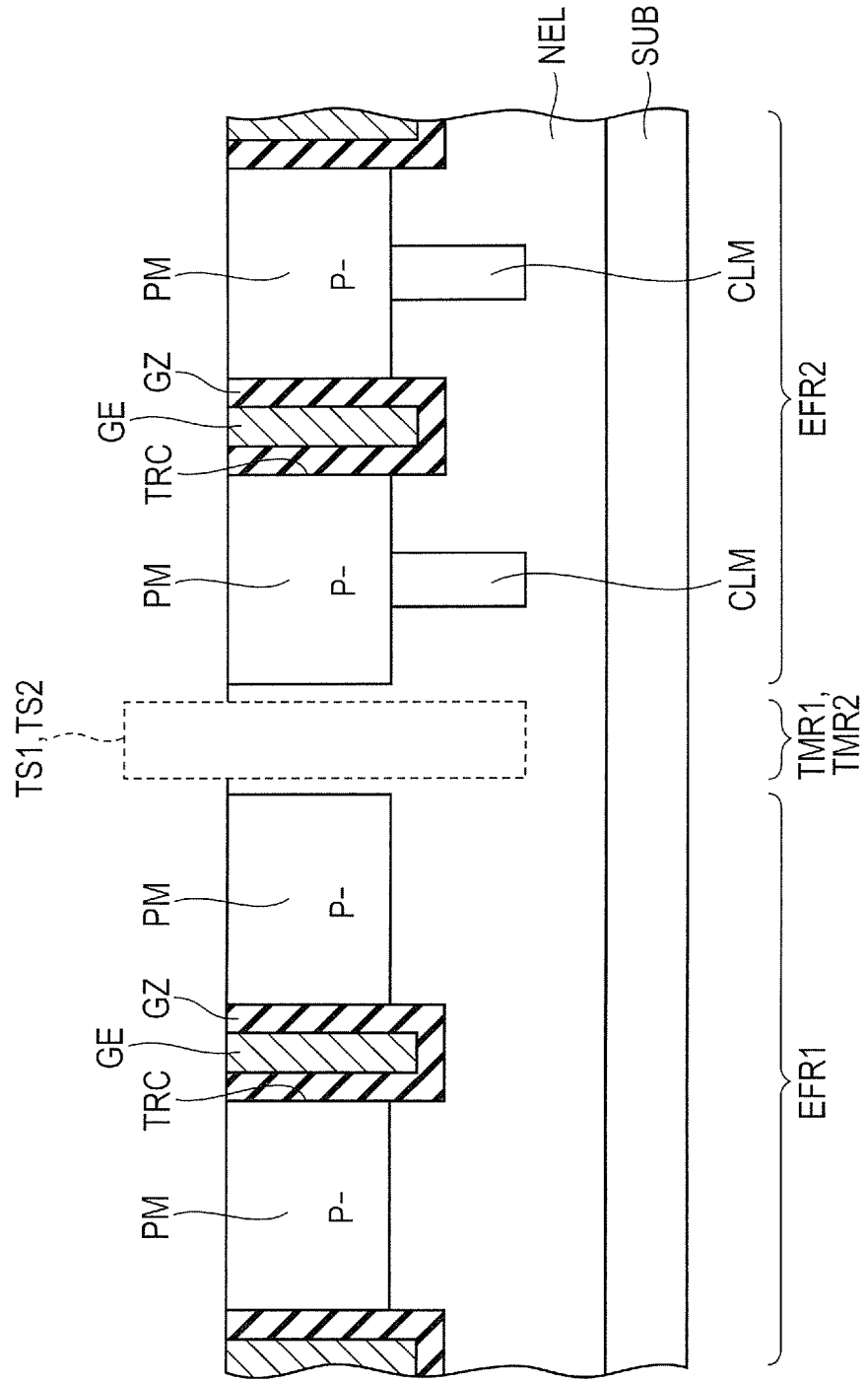
FIG. 8 is a partial cross-sectional view showing a step performed after the step of FIG. 7 according to the first embodiment.

As shown in FIG. 7, the gate electrodes GE are formed in the trenches TRC via the gate insulating films GZ by an ordinary method. Subsequently, predetermined photoengraving is performed to form a resist pattern (not shown) for forming a P− region. The P-type impurity is then injected with the resist pattern serving as an injection mask, forming the P− regions PM (FIG. 8). After that, the resist pattern is removed. As shown in FIG. 8, the P− region PM is formed from the surface of the epitaxial layer NEL to a depth smaller than that of the bottom of the trench TRC.

Figure 9:
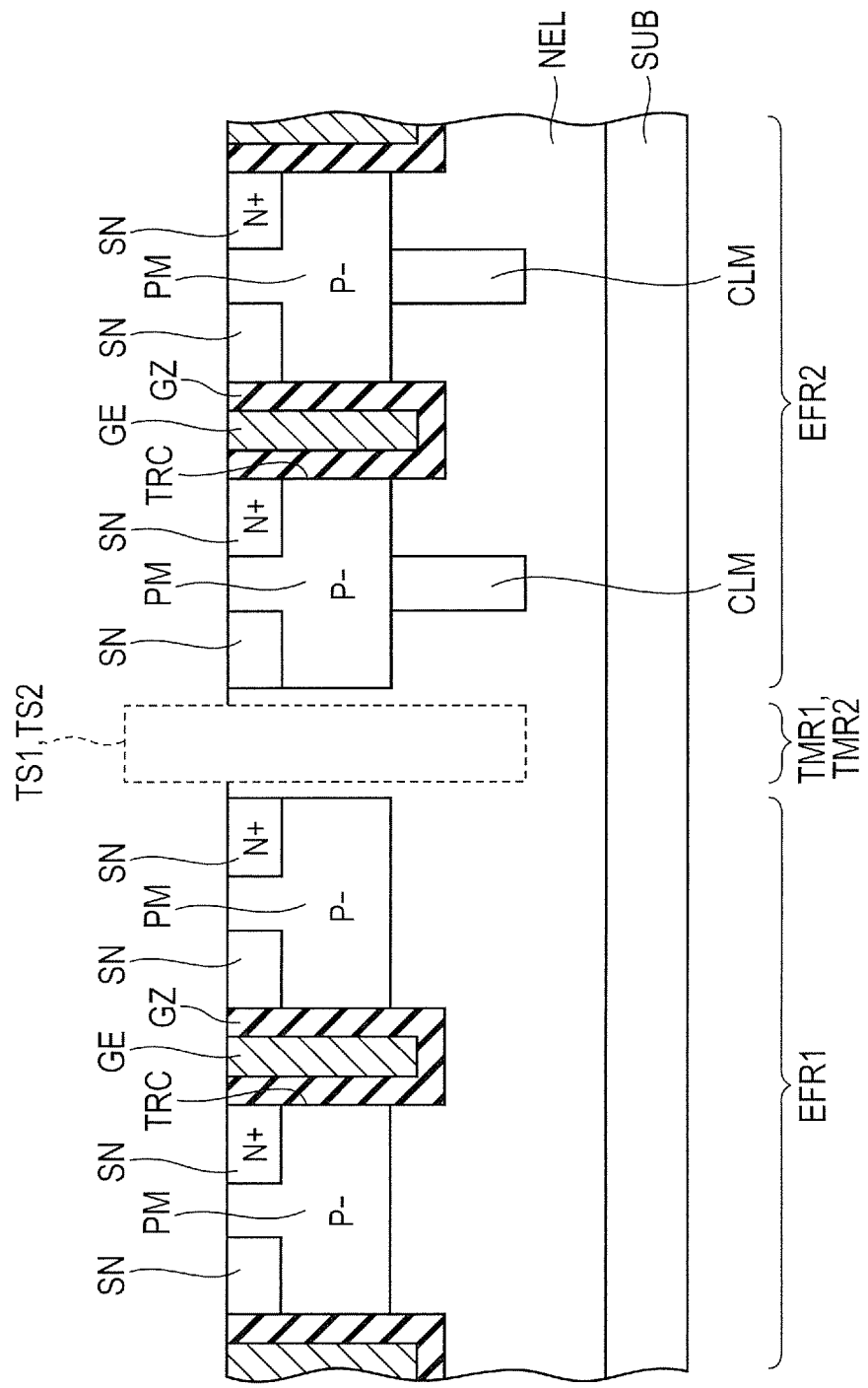
FIG. 9 is a partial cross-sectional view showing a step performed after the step of FIG. 8 according to the first embodiment.

Subsequently, predetermined photoengraving is performed to form a resist pattern (not shown) for forming an N+ region. An N-type impurity is then injected with the resist pattern serving as an injection mask, forming the N+ region SN (FIG. 9). After that, the resist pattern is removed. As shown in FIG. 9, the N+ region SN is formed from the surface of the P− region PM to a depth smaller than that of the bottom of the P− region PM.

Figure 10:
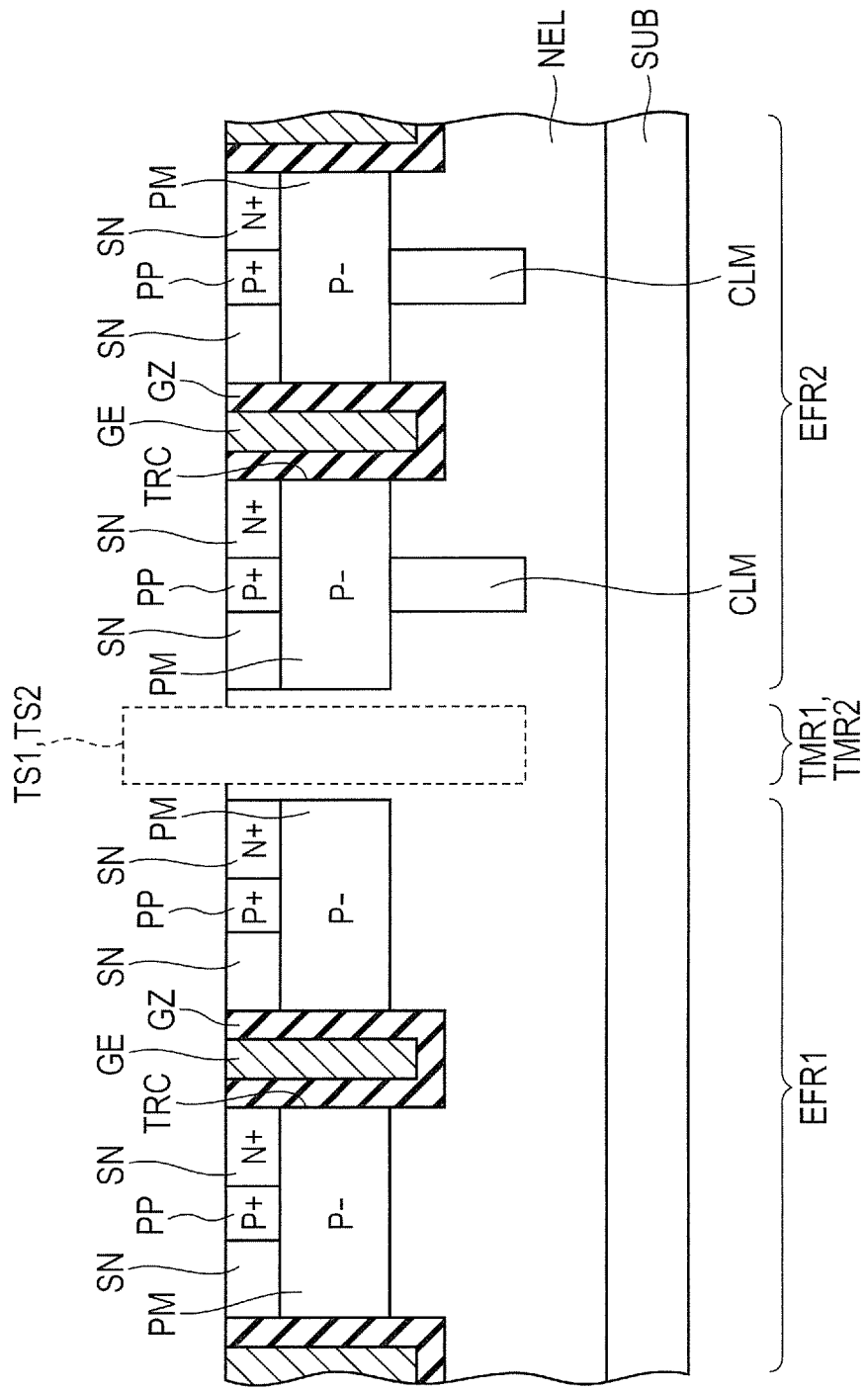
FIG. 10 is a partial cross-sectional view showing a step performed after the step of FIG. 9 according to the first embodiment.

Subsequently, predetermined photoengraving is performed to form a resist pattern (not shown) for forming a P+ region. A P-type impurity is injected with the resist pattern serving as an injection mask, forming the P+ region PP (FIG. 10). After that, the resist pattern is removed. As shown in FIG. 10, the P+ region PP is formed from the surface of the P− region PM to the same depth as the N+ region SN.

Figure 11:
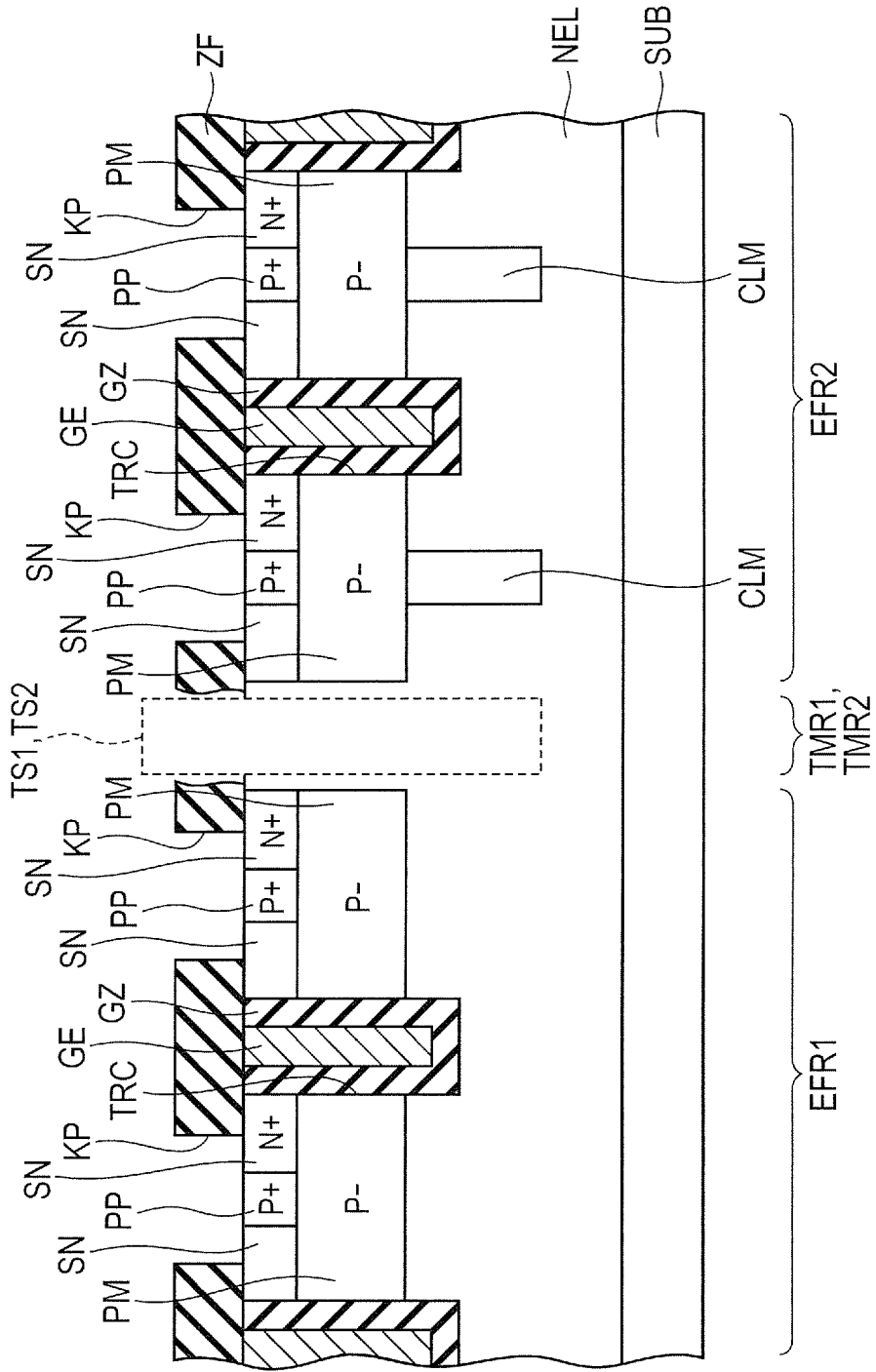
FIG. 11 is a partial cross-sectional view showing a step performed after the step of FIG. 10 according to the first embodiment.

Subsequently, an interlayer insulating film ZF is formed over the gate electrodes GE (FIG. 11). Subsequently, predetermined photoengraving is performed to form a resist pattern (not shown) for forming contact holes. The interlayer insulating film ZF is etched with the resist pattern serving as an etching mask, forming openings KP (FIG. 11). After that, the resist pattern is removed. As shown in FIG. 11, the N+ region SN and the P+ region PP are exposed at the bottom of the opening KP serving as a contact hole.

Figure 12:
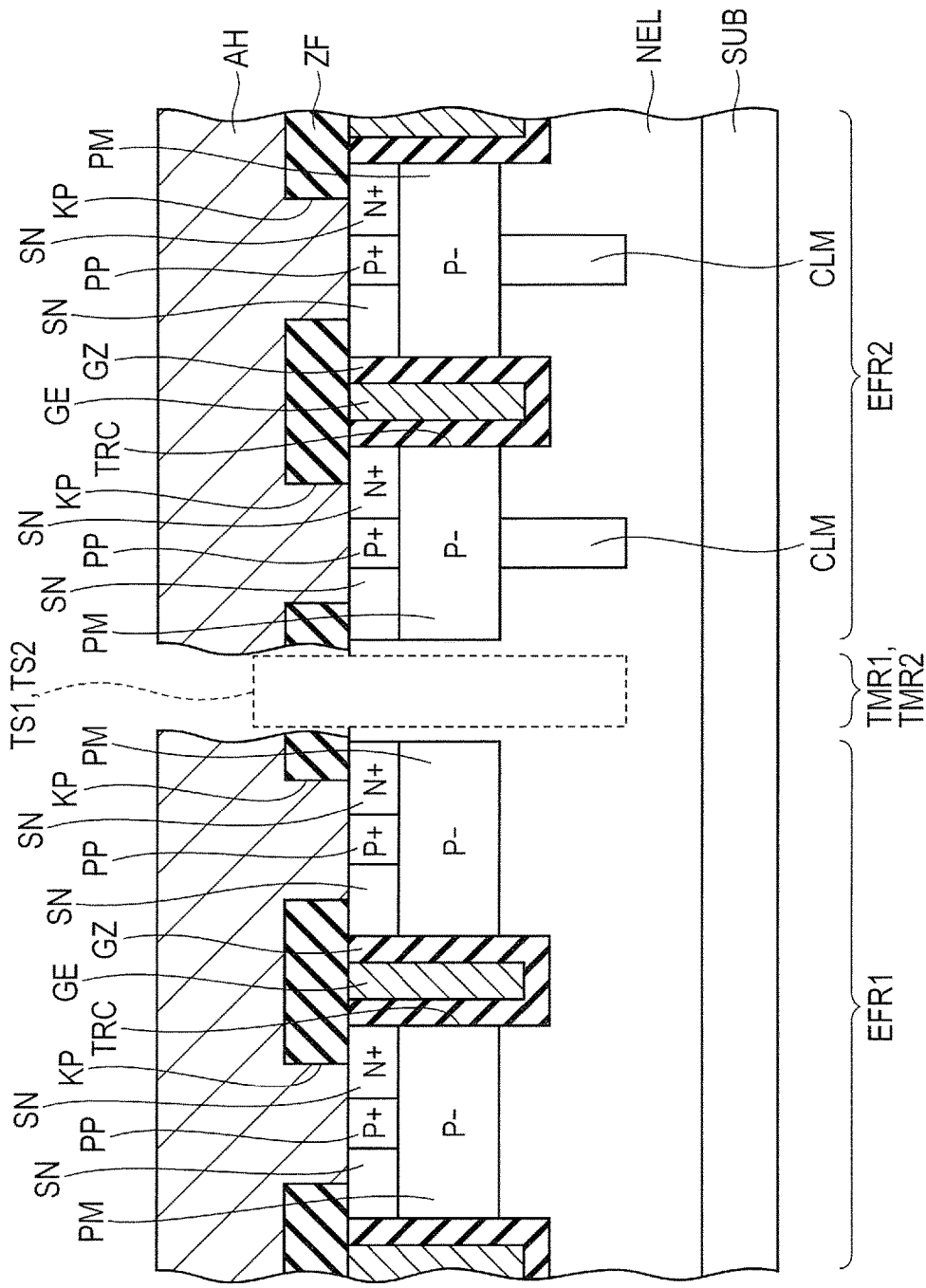
FIG. 12 is a partial cross-sectional view showing a step performed after the step of FIG. 11 according to the first embodiment.
Figure 13:
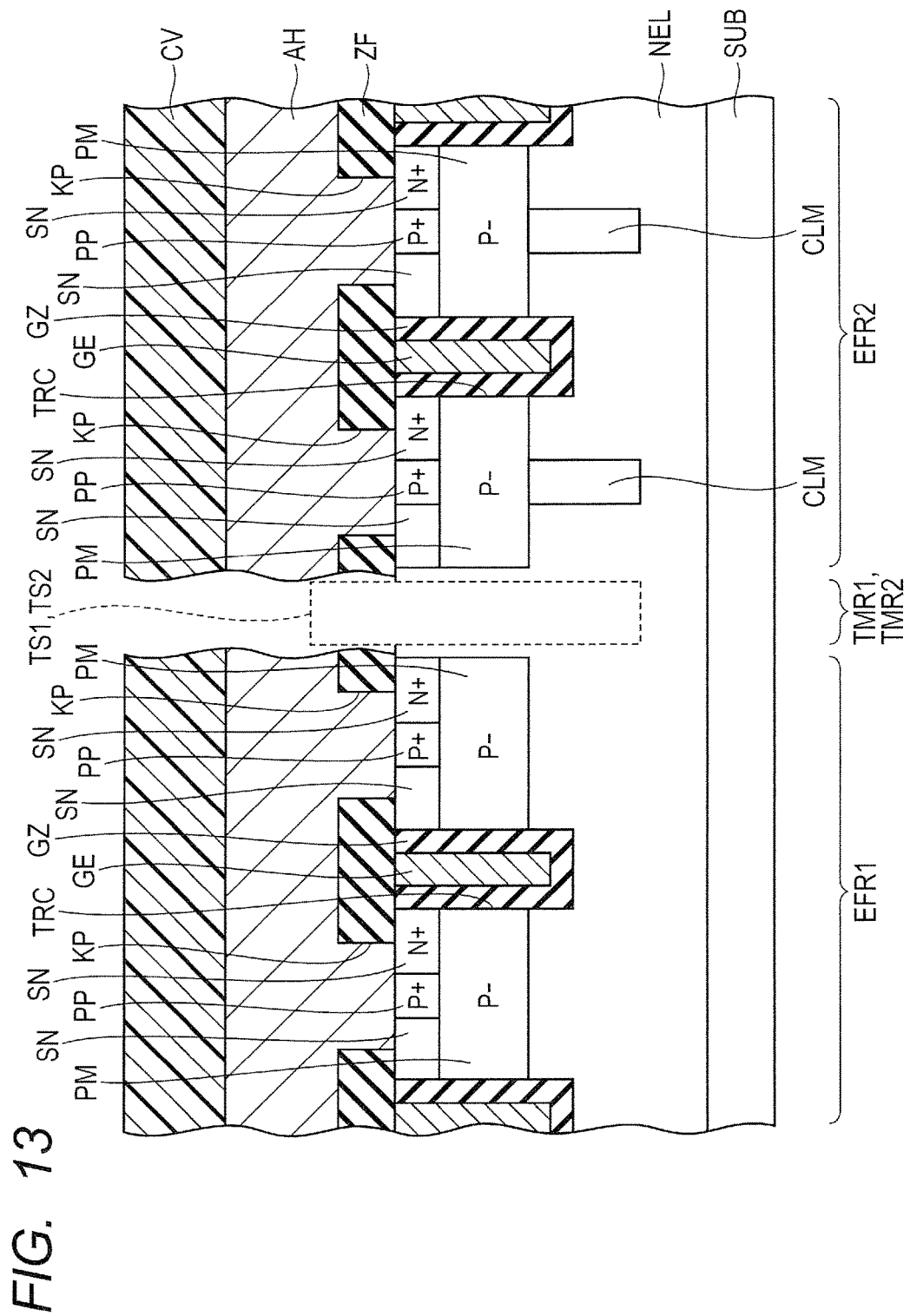
FIG. 13 is a partial cross-sectional view showing a step performed after the step of FIG. 12 according to the first embodiment.

An aluminum film (not shown) is then formed by, for example, sputtering so as to fill the openings KP and so on. Subsequently, predetermined photoengraving and etching are performed to form aluminum wiring AH as shown in FIG. 12. As shown in FIG. 13, a cover CV is then arranged over the aluminum wiring AH. Thus, the semiconductor device including the first power MOS transistor and the second power MOS transistor is formed on the semiconductor substrate shaped like a wafer.

After that, the semiconductor substrate (wafer) is diced such that the semiconductor substrate having the first power MOS transistor and the second power MOS transistor is collected as a chip. The collected semiconductor substrate is mounted on a lead frame so as to be completed as a semiconductor device.

The operations of the semiconductor device will be described below. First, appropriate coupling of the battery will be discussed (FIG. 1). In this case, a voltage not lower than a threshold voltage is applied to the gate G1 of the first power MOS transistor Q1 and the gate G2 of the second power MOS transistor Q2, turning on the first power MOS transistor Q1 and the second power MOS transistor Q2. This applies a current from the battery BA to the second power MOS transistor Q2 through the first power MOS transistor Q1, supplying power to the load LAD.

Figure 14:
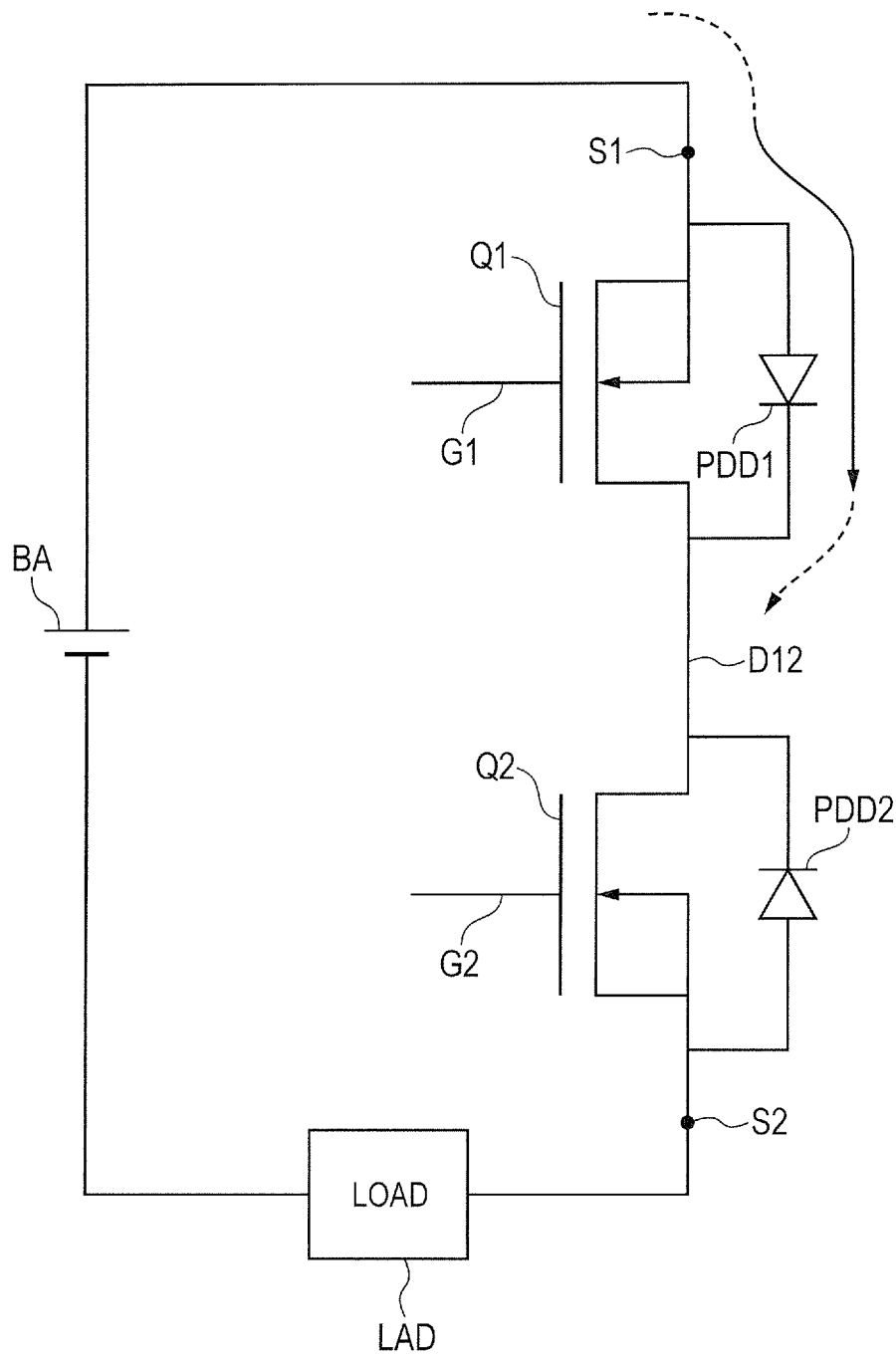
FIG. 14 is a circuit diagram for explaining the operations of the semiconductor device in appropriate coupling of a battery according to the first embodiment.

Subsequently, the gate G2 is electrically short-circuited with the source S2, turning off the second power MOS transistor Q2. At this point, as shown in FIG. 14, a current passes through a parasitic diode PDD1 regardless of the state (on or off) of the first power MOS transistor Q1, increasing the potential of the common drain D12. A withstand voltage at this point is kept by the second power MOS transistor Q2 having a withstand voltage of about 40 V, thereby preventing a current from passing through the circuit.

Figure 15:
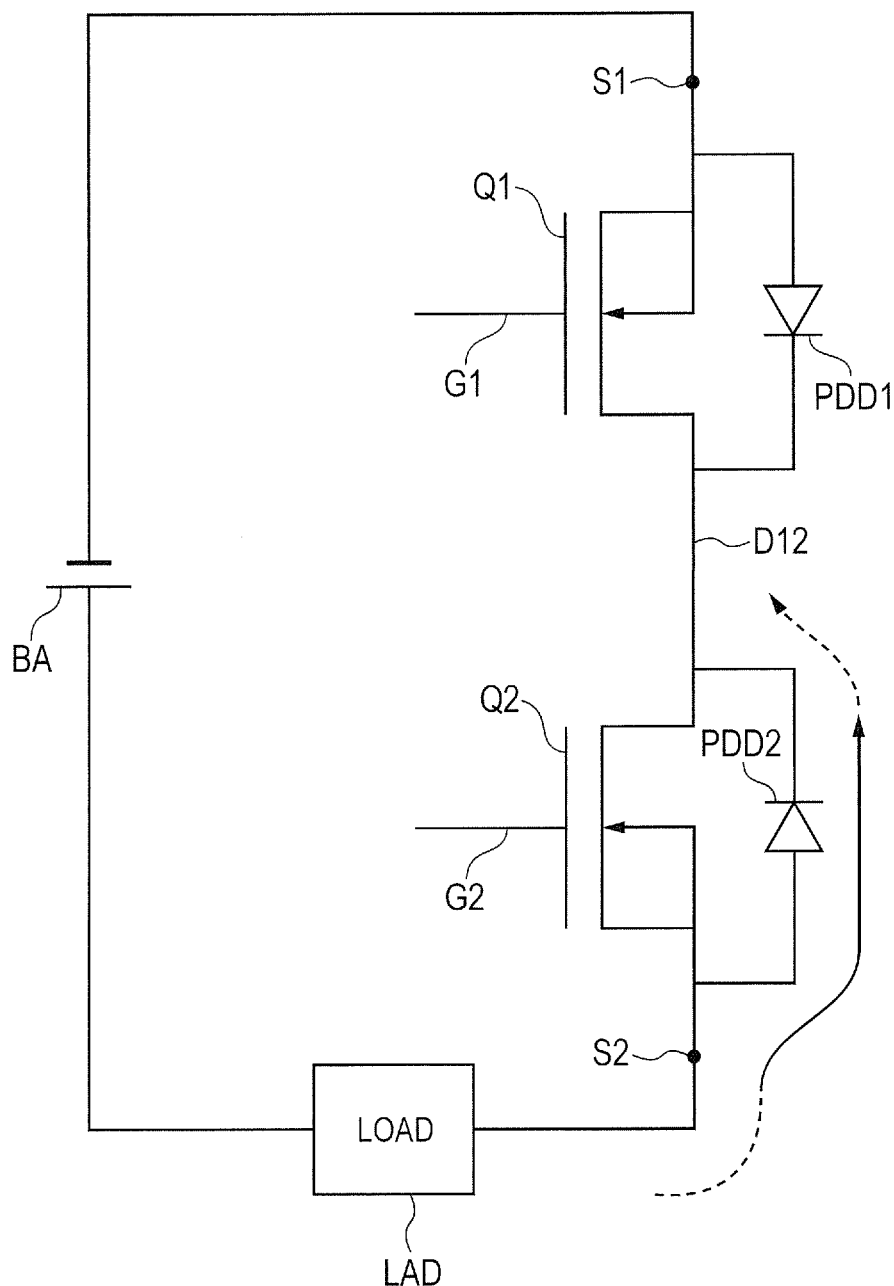
FIG. 15 is a circuit diagram for explaining the operations of the semiconductor device in reverse coupling of the battery according to the first embodiment.

The reverse coupling of the battery will be discussed below. In this case, the first power MOS transistor Q1 is turned off. At this point, as shown in FIG. 15, a current passes through a parasitic diode PDD2 regardless of the state (on or off) of the second power MOS transistor Q2, increasing the potential of the common drain D12. A withstand voltage at this point can be kept by the first power MOS transistor Q1 having a withstand voltage of about 16 V, which is slightly higher than the voltage (12 V) of the battery BA. This can prevent backflow of current to the circuit.

Thus, the semiconductor device as a switch can prevent a current from passing through the circuit in the appropriate coupling of the battery BA to the semiconductor device and reverse coupling of the battery BA to the semiconductor device.

Furthermore, the semiconductor device can reduce an on resistance in the appropriate coupling of the battery BA to the semiconductor device. The semiconductor device will be compared with a semiconductor device according to a comparative example.

Figure 16:
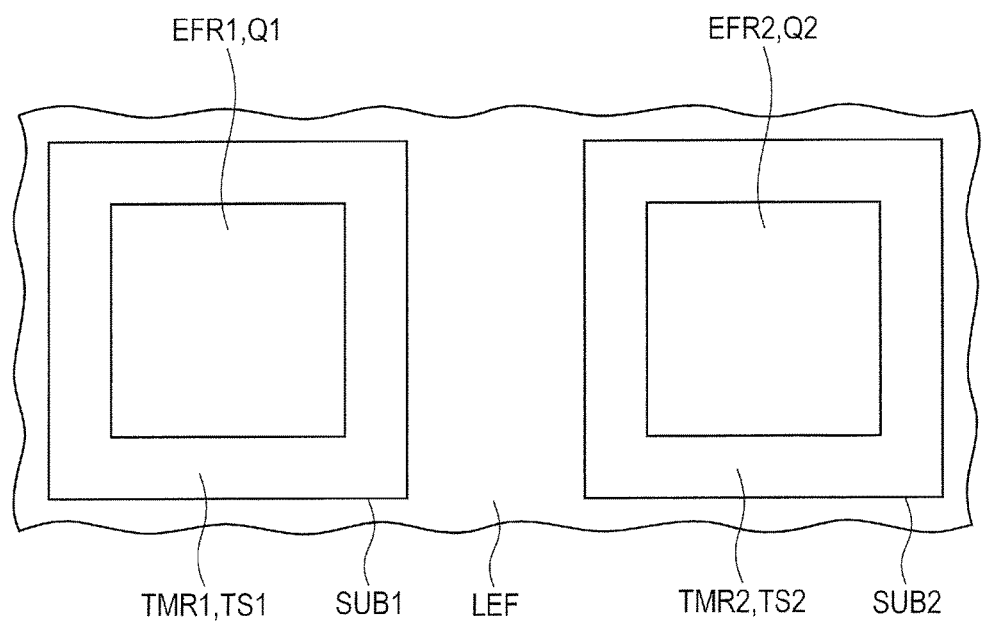
FIG. 16 shows a plane pattern of a semiconductor device according to a comparative example.
Figure 17:
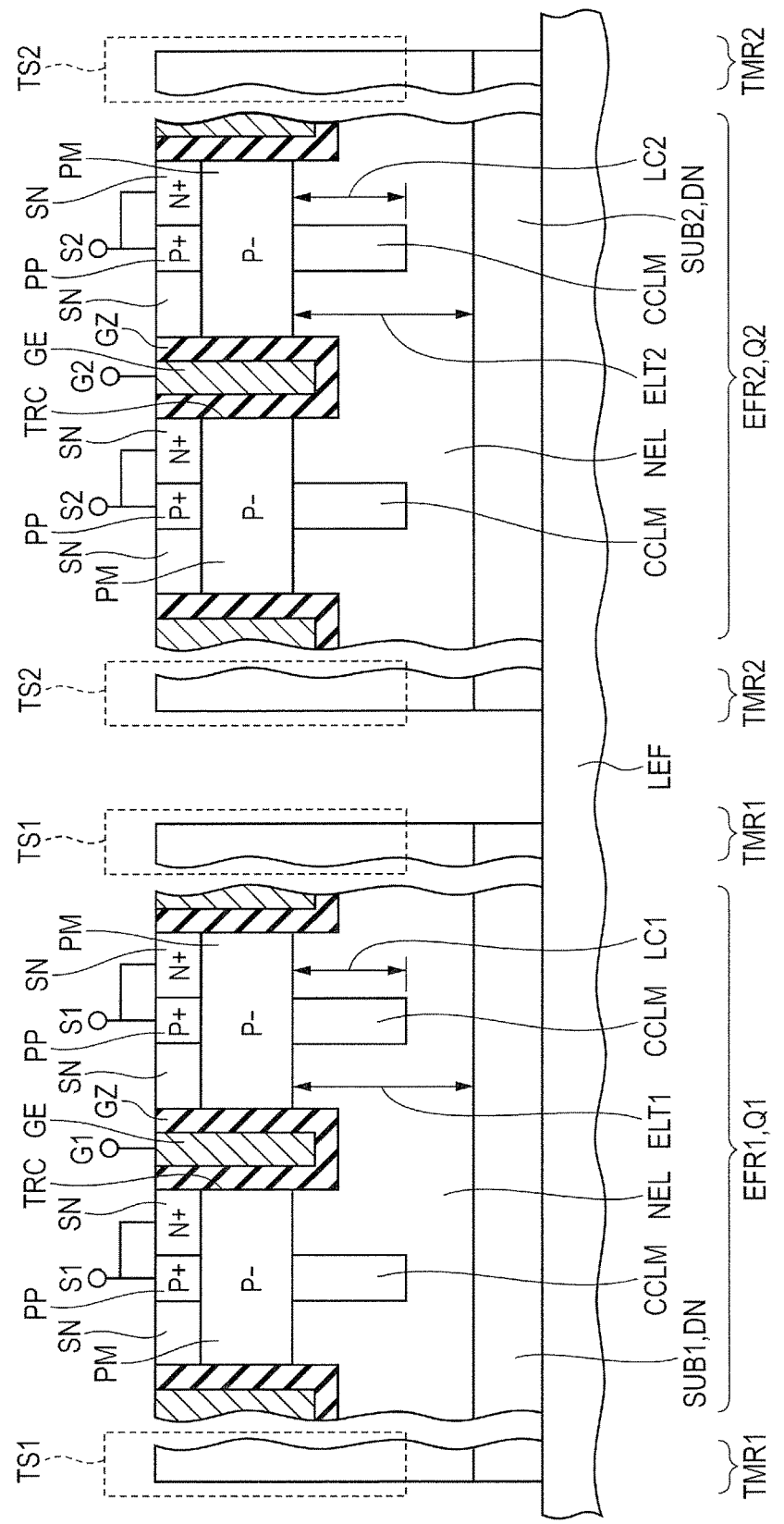
FIG. 17 is a partial cross-sectional view showing the semiconductor device according to the comparative example.

As shown in FIGS. 16 and 17, in the semiconductor device according to the comparative example, a first power MOS transistor Q1 and a second power MOS transistor Q2 are formed on separate semiconductor substrates SUB1 and SUB2. The first power MOS transistor Q1 is formed in an N-type epitaxial layer NEL that is grown on the surface of the semiconductor substrate SUB1, and the second power MOS transistor Q2 is formed in the N-type epitaxial layer NEL that is grown on the surface of the semiconductor substrate SUB2. The semiconductor substrate SUB1 and the semiconductor substrate SUB2 are mounted on, for example, a lead frame LEF.

The first power MOS transistor Q1 and the second power MOS transistor Q2 are power MOS transistors, each having a SJ structure including columns with a withstand voltage set in view of a load dump surge relative to the voltage of a battery. A column CCLM of the first power MOS transistor Q1 has a length LC1 identical to a length LC2 of a column CCLM of the second power MOS transistor Q2. If the battery has a voltage of 12 V, the lengths LC1 and LC2 are about 1.5 µm. The N-type epitaxial layer NEL has a thickness of about 2 µm. The same members as those of the semiconductor device according to the embodiment are indicated by the same reference numerals and will not be repeatedly discussed unless otherwise necessary.

In the semiconductor device according to the comparative example, in an off state where the battery is appropriately coupled (FIG. 1), a withstand voltage is kept by the second power MOS transistor Q2, thereby preventing a current from passing through a circuit. In an off state where the battery is reversely coupled, a withstand voltage is kept by the first power MOS transistor Q1, thereby preventing backflow of current to the circuit.

Figure 18:
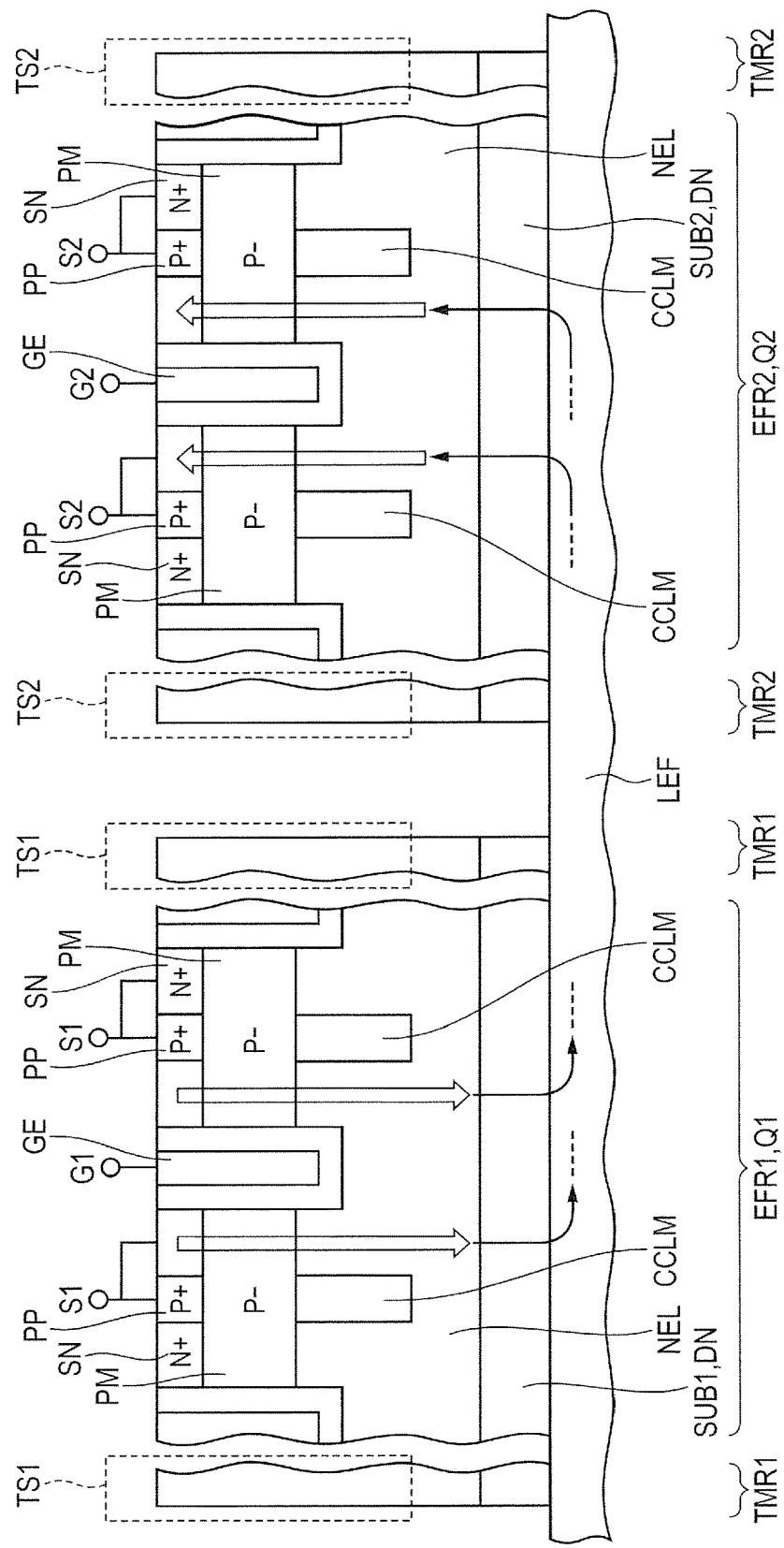
FIG. 18 is a partial cross-sectional view schematically showing a current in an on state of the semiconductor device according to the comparative example.

Unlike in an off state, in an on state where the battery is appropriately coupled, a current flows as shown in FIG. 18 from a source S1 of the first power MOS transistor Q1 to a source S2 of the second power MOS transistor Q2 through the semiconductor substrate SUB1 (drain), the lead frame LEF, and the semiconductor substrate SUB2 (drain).

At this point, the column CCLM of the first power MOS transistor Q1 and the column CCLM of the second power MOS transistor Q1 are arranged on a current path, causing the columns CCLM to interrupt the current flow. This increases the on resistance of the semiconductor device acting as a switch.

Figure 19:
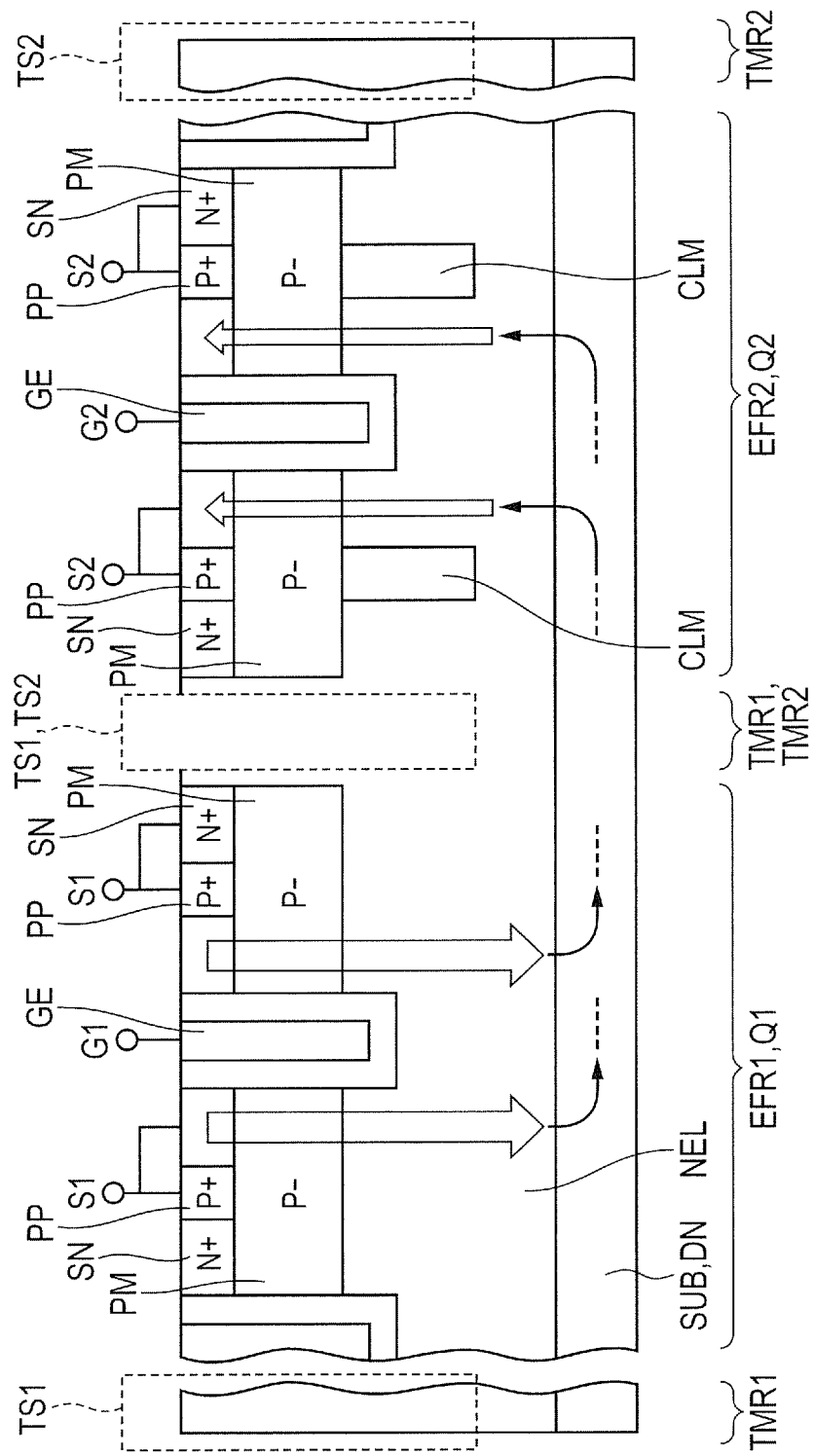
FIG. 19 is a partial cross-sectional view schematically showing a current in an on state of the semiconductor device according to the first embodiment.

As shown in FIGS. 3 and 4, unlike in the comparative example, the first power MOS transistor Q1 of the semiconductor device according to the first embodiment does not include columns. Thus, as shown in FIG. 19, the current path does not have columns and thus the amount of current can be increased accordingly (See thick arrows). This can reduce the on resistance of the semiconductor device acting as a switch.

Thus, the semiconductor device according to the first embodiment can reliably prevent backflow of current in reverse coupling of the battery BA, and reduce an on resistance in appropriate coupling of the battery BA.

In the semiconductor device according to the first embodiment, the first power MOS transistor Q1 having the columnless structure and the second power MOS transistor Q1 having the SJ structure are formed on the same semiconductor substrate SUB. Thus, the size of the semiconductor device can be reduced as a chip as compared with the comparative example in which the first power MOS transistor Q1 having the SJ structure and the second power MOS transistor Q1 having the SJ structure are formed on the separate semiconductor substrates SUB1 and SUB2. This configuration can contribute to cost and size reduction of the semiconductor device.

Moreover, in the semiconductor device according to the first embodiment, the second power MOS transistor Q1 and the first power MOS transistor Q1 having the columnless structure can be simultaneously formed only by using a mask pattern (FIG. 6) for forming the columns of the second power MOS transistor Q1 having the SJ structure. This can manufacture the semiconductor device without additional steps.

(Modification)

In the semiconductor device according to the first embodiment, the P– regions PM serving as channels are arranged at the same depth in the first power MOS transistor Q1 and the second power MOS transistor Q1. This modification will describe an example of a semiconductor device where a first power MOS transistor Q1 and a second power MOS transistor Q1 have P– regions PM at different depths.

Figure 20:
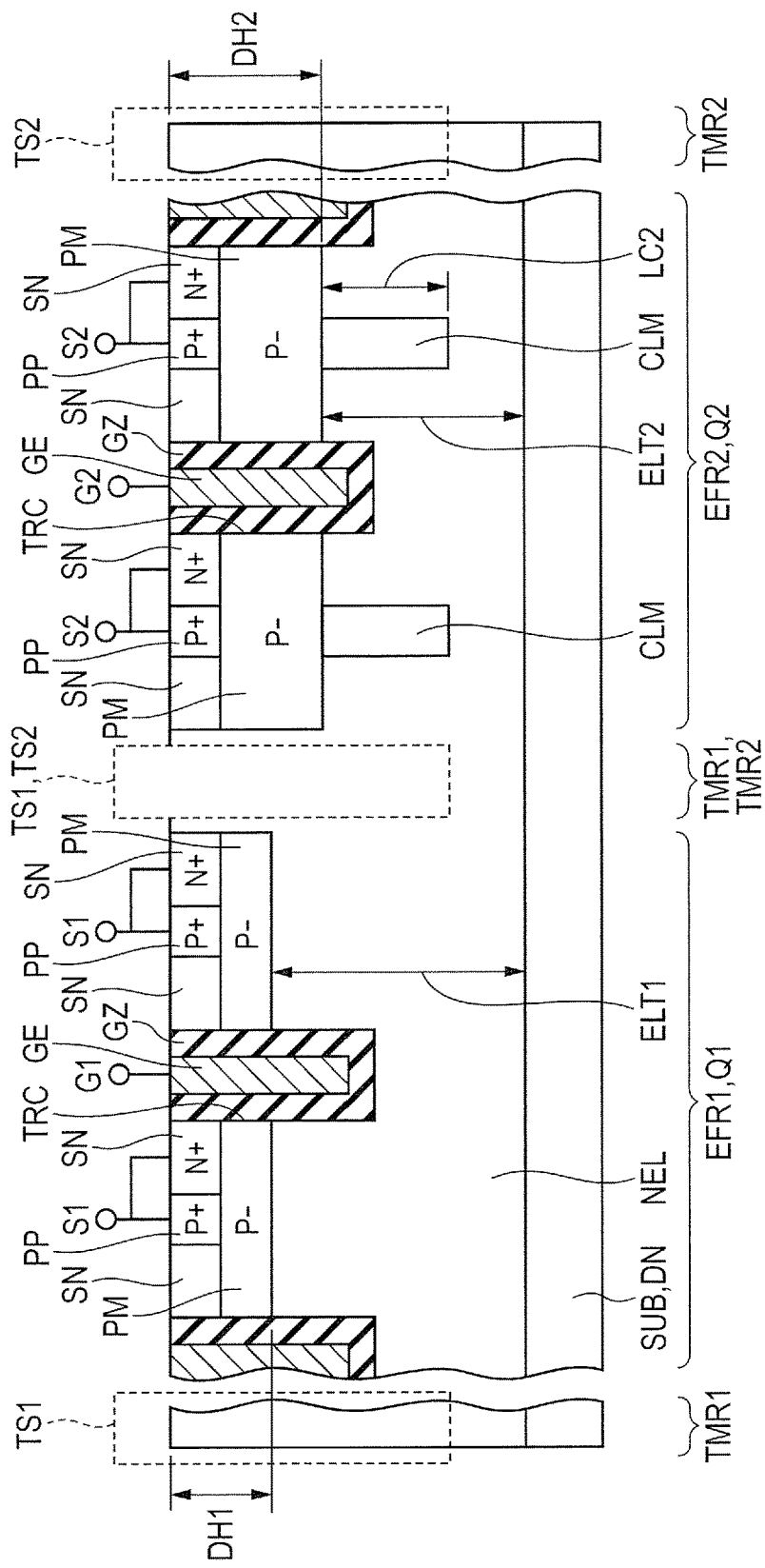
FIG. 20 is a partial cross-sectional view showing a semiconductor device according to a modification of the first embodiment.

As shown in FIG. 20, the P– region PM of a first element formation region EFR1 (first power MOS transistor Q1) has a depth DH1 smaller than a depth DH2 of the P– region PM of a second element formation region EFR2 (second power MOS transistor Q2). Moreover, an N+ region SN in the first element formation region EFR1 has the same depth as that of the second element formation region EFR2. Thus, the P– region PM of the first element formation region EFR1 is substantially smaller in thickness than the P– region PM of the second element formation region EFR2.

Other configurations are identical to those of the semiconductor device shown in FIG. 4 and thus the same members are indicated by the same reference numerals and will not be repeatedly discussed unless otherwise necessary.

Figure 21:
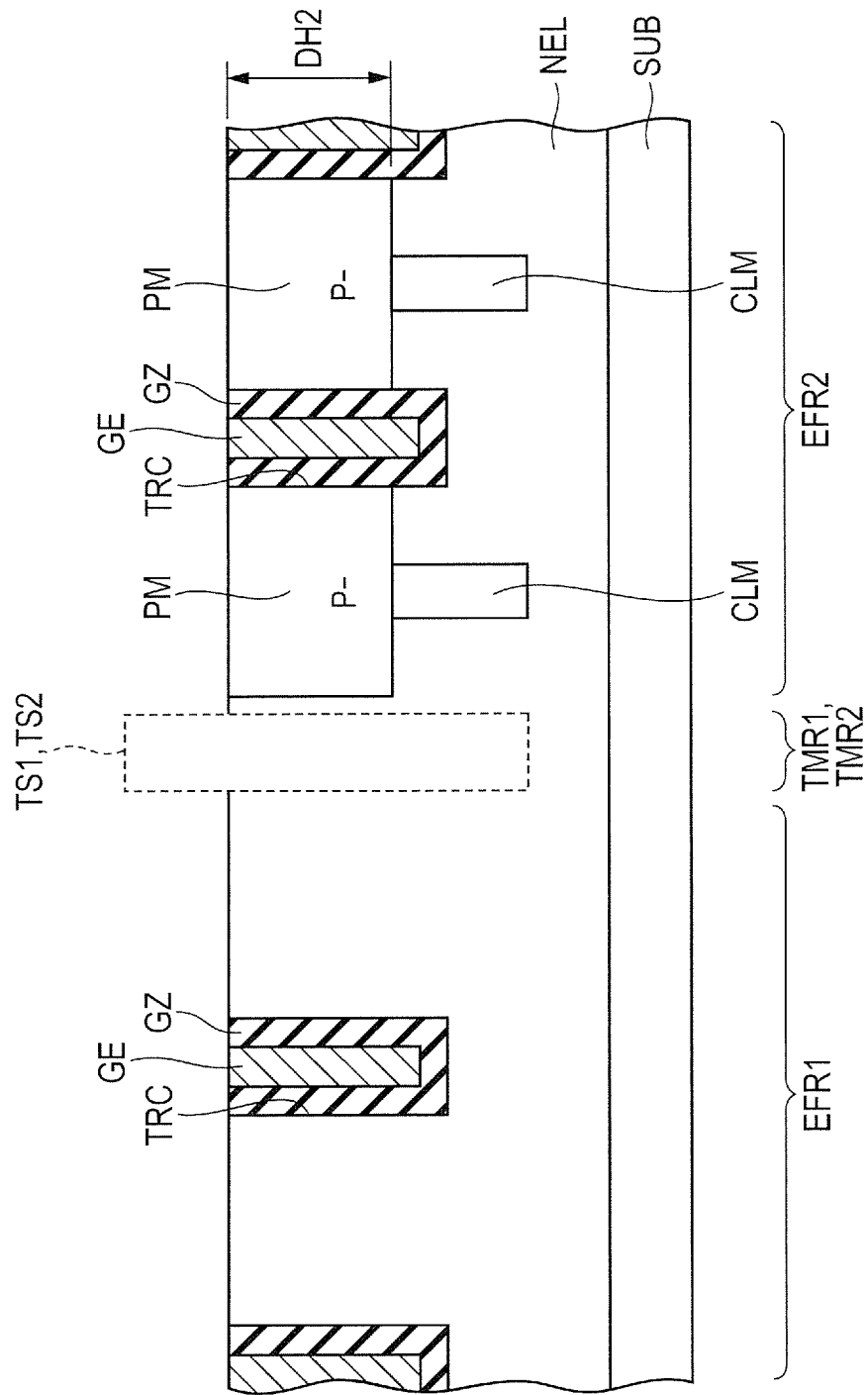
FIG. 21 is a partial cross-sectional view showing one step of the manufacturing method of the semiconductor device according to the modification of the first embodiment.

A method of manufacturing the semiconductor device according to the modification will be simply discussed below. First, after the same steps as those of FIGS. 5 to 7, predetermined photoengraving is performed to expose the second element formation region and form a resist pattern covering the first element formation region. Subsequently, a P-type impurity is injected with the resist pattern serving as an injection mask (Injection A). The resist pattern is then removed. Thus, as shown in FIG. 21, the P– region PM is formed from the surface of the epitaxial layer NEL to the depth DH2 in the second element formation region EFR2.

Figure 22:
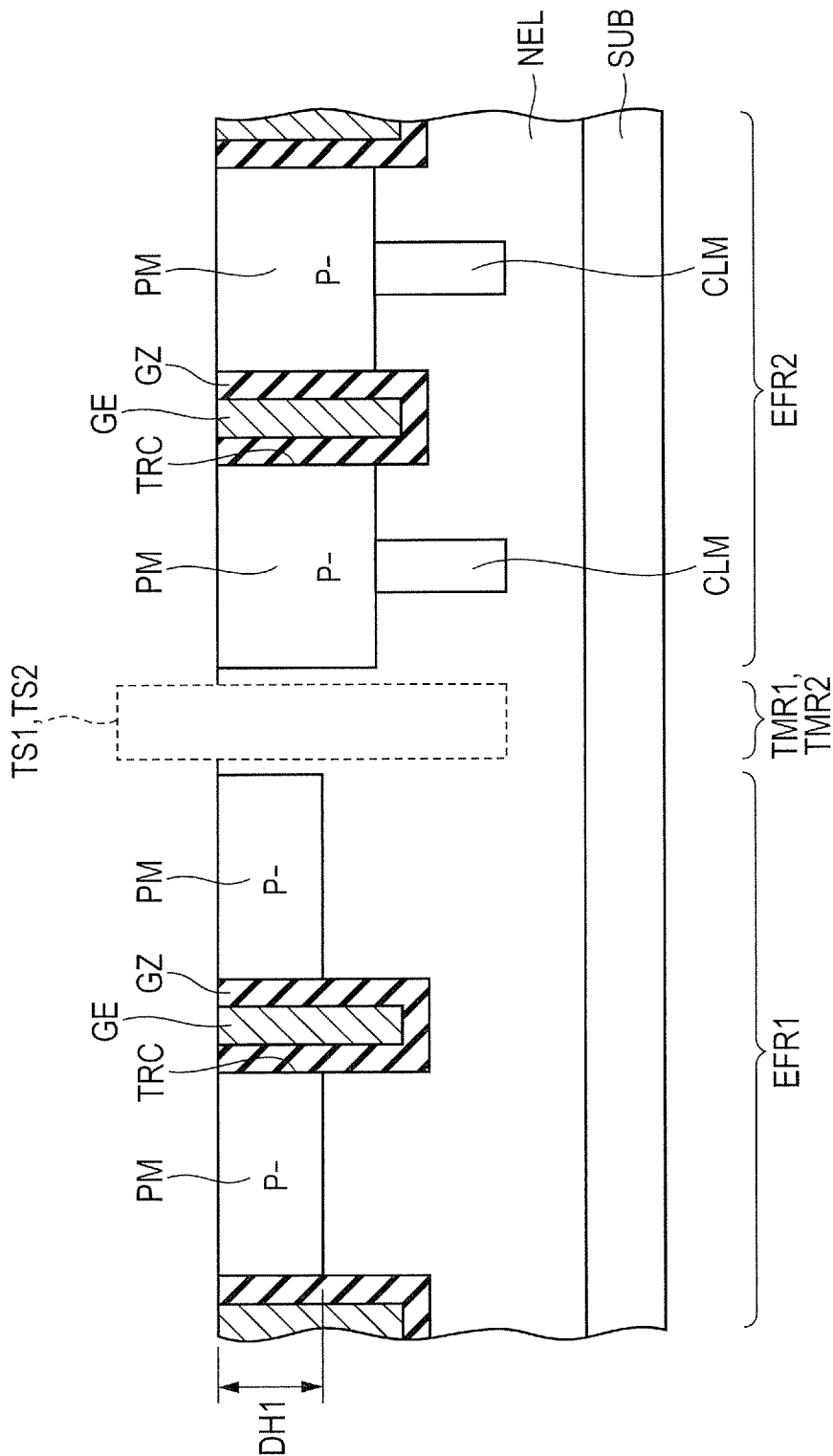
FIG. 22 is a partial cross-sectional view showing a step performed after the step of FIG. 21 according to the first embodiment.

After that, predetermined photoengraving is performed to expose the first element formation region and form a resist pattern (not shown) covering the second element formation region. Subsequently, a P-type impurity is injected with lower injection energy than that of Injection A (Injection B). The resist pattern is then removed. Thus, as shown in FIG. 22, the P– region PM is formed from the surface of the epitaxial layer NEL to the depth DH1 (<DH2) in the first element formation region EFR1. After that, the semiconductor device is completed through the same steps as those of FIGS. 9 to 13.

In the semiconductor device according to the modification, the P− region PM of the first element formation region EFR1 is substantially smaller in thickness than the P− region PM of the second element formation region EFR2, thereby further reducing the on resistance of the first power MOS transistor Q1. This configuration can contribute to a reduction in the on resistance of the semiconductor device acting as a switch.

Second Embodiment

A semiconductor device used for a 24-V battery will be described below. The semiconductor device includes two power MOS transistors having SJ structures.

Figure 23:
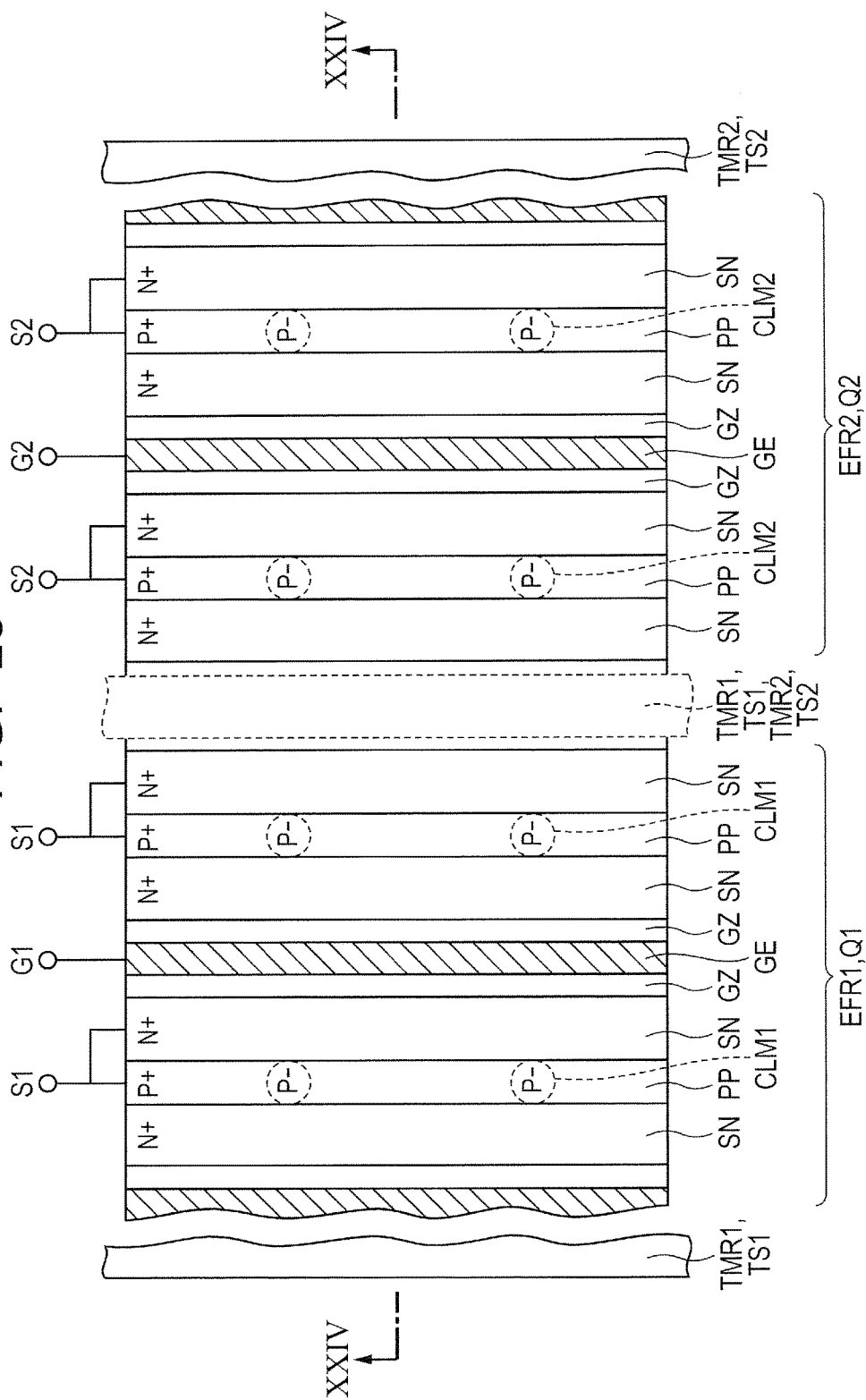
FIG. 23 is a partial plan view showing the planar structure of a semiconductor device according to a second embodiment.
Figure 24:
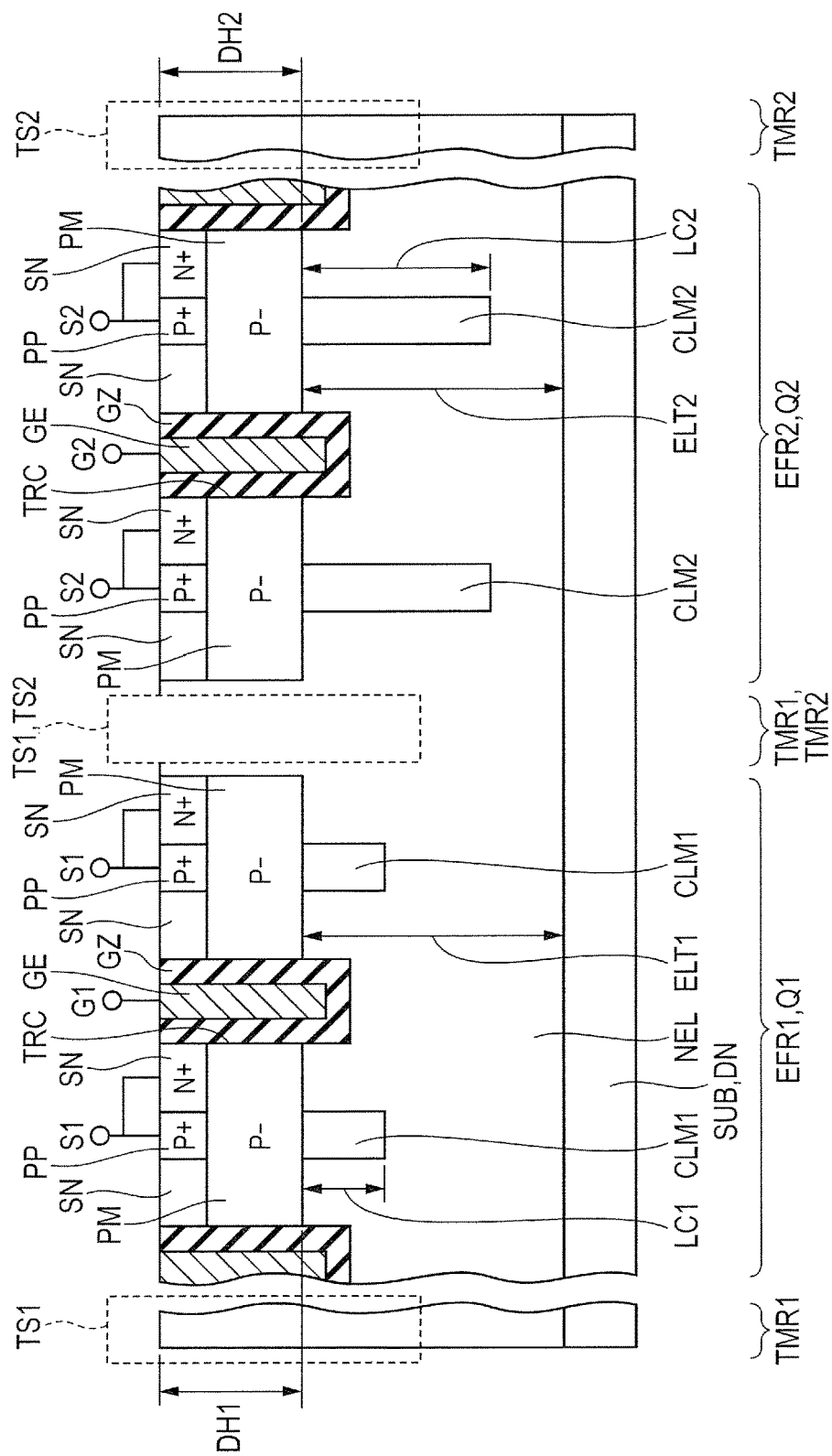
FIG. 24 is a partial cross-sectional view taken along line XXIV-XXIV of FIG. 23 according to the second embodiment.

As shown in FIGS. 23 and 24, in a second element formation region EFR2 having a second power MOS transistor Q2, second columns CLM2 are formed in contact with a P− region PM so as to extend toward a semiconductor substrate SUB. The second column CLM2 has a length LC2 of, for example, about 2.5 μm.

In a first element formation region EFR1 having a first power MOS transistor Q1, first columns CLM1 are formed in contact with the P− region PM so as to extend toward the semiconductor substrate SUB. The first column CLM1 has a length LC1 shorter than the length LC2 of the second column CLM2.

An epitaxial layer NEL in the first element formation region EFR1 has a thickness ELT1 of, for example, about 3 μm that is equal to a thickness ELT2 of the epitaxial layer NEL in the second element formation region EFR2. The P− region PM of the first element formation region EFR1 has a depth DH1 that is equal to a depth DH2 of the P− region PM of the second element formation region EFR2. Other configurations are identical to those of FIGS. 2 and 3 and thus the same members are indicated by the same reference numerals and will not be repeatedly discussed unless otherwise necessary.

If the battery has a voltage of 24 V, the power MOS transistor needs to have a withstand voltage of about 60 V in view of a load dump surge. In the case of reverse coupling of the battery, the withstand voltage of the power MOS transistor (24 V+several voltages) only needs to be slightly higher than the voltage of the battery in order to prevent backflow of current. In the semiconductor device, a withstand voltage of about 60 V is obtained by the second power MOS transistor Q2 having the SJ structure with the relatively long columns, whereas a withstand voltage slightly higher than the voltage of the battery is obtained by the first power MOS transistor Q1 having the SJ structure with the relatively short columns.

Figure 25:
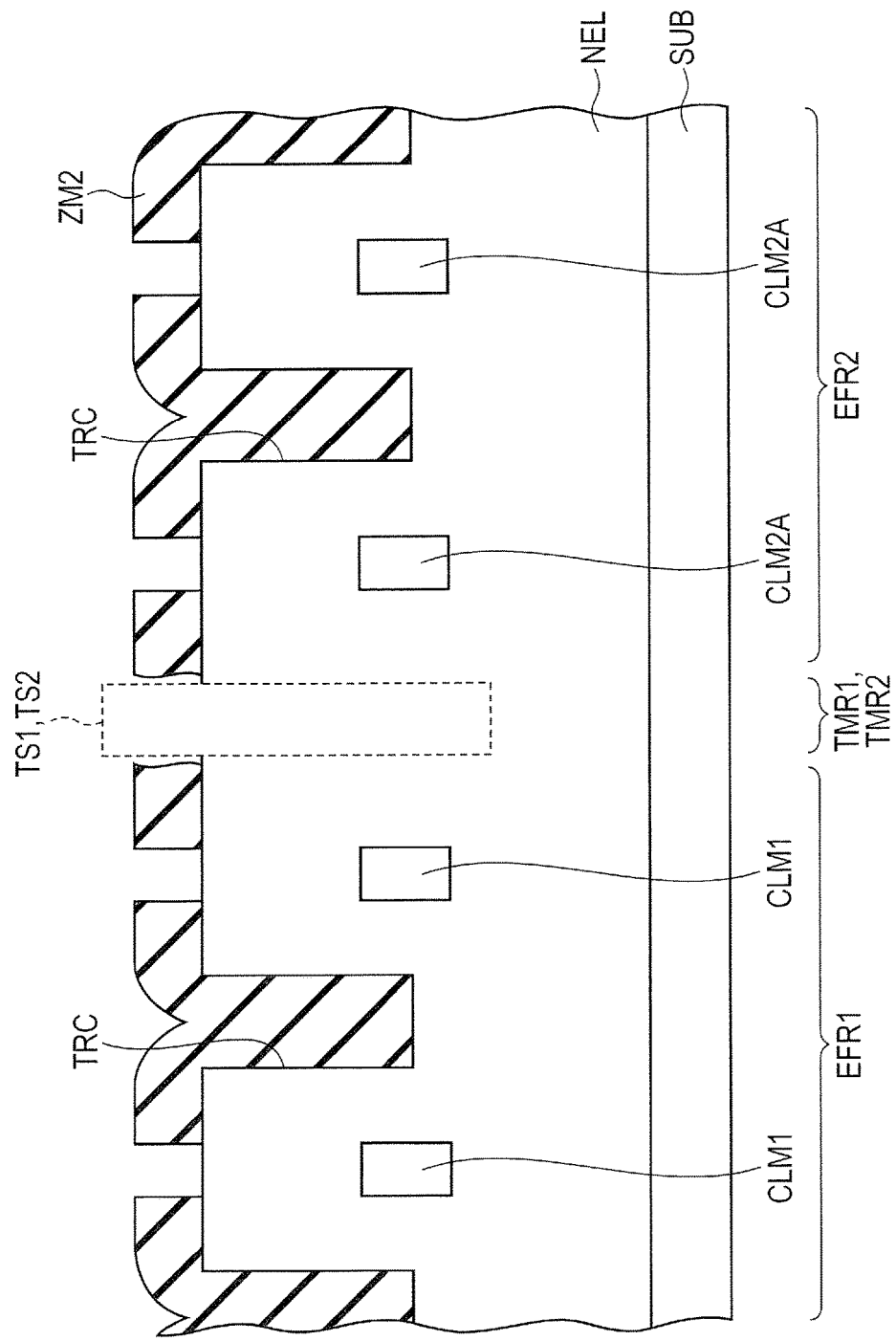
FIG. 25 is a partial cross-sectional view showing one step of the manufacturing method of the semiconductor device according to the second embodiment.

An example of a method of manufacturing the semiconductor device will be described below. First, after the same step as that of FIG. 5, an insulating film (not shown), e.g., a silicon oxide film serving as a mask member is formed over the epitaxial layer NEL. The insulating film is then subjected to photoengraving and etching so as to form an insulating film ZM1 that has openings for exposing column portions in the first element formation region EFR1 and openings for exposing column portions in the second element formation region EFR2 as shown in FIG. 25.

Subsequently, a P-type impurity is injected (Injection C) with the insulating film ZM2 serving as an injection mask, forming the P-type first columns CLM1 that extend toward the semiconductor substrate SUB. In the second element formation region EFR2, P-type second-column first portions CLM2A are formed so as to extend toward the semiconductor substrate SUB. The insulating film ZM2 is then removed.

Figure 26:
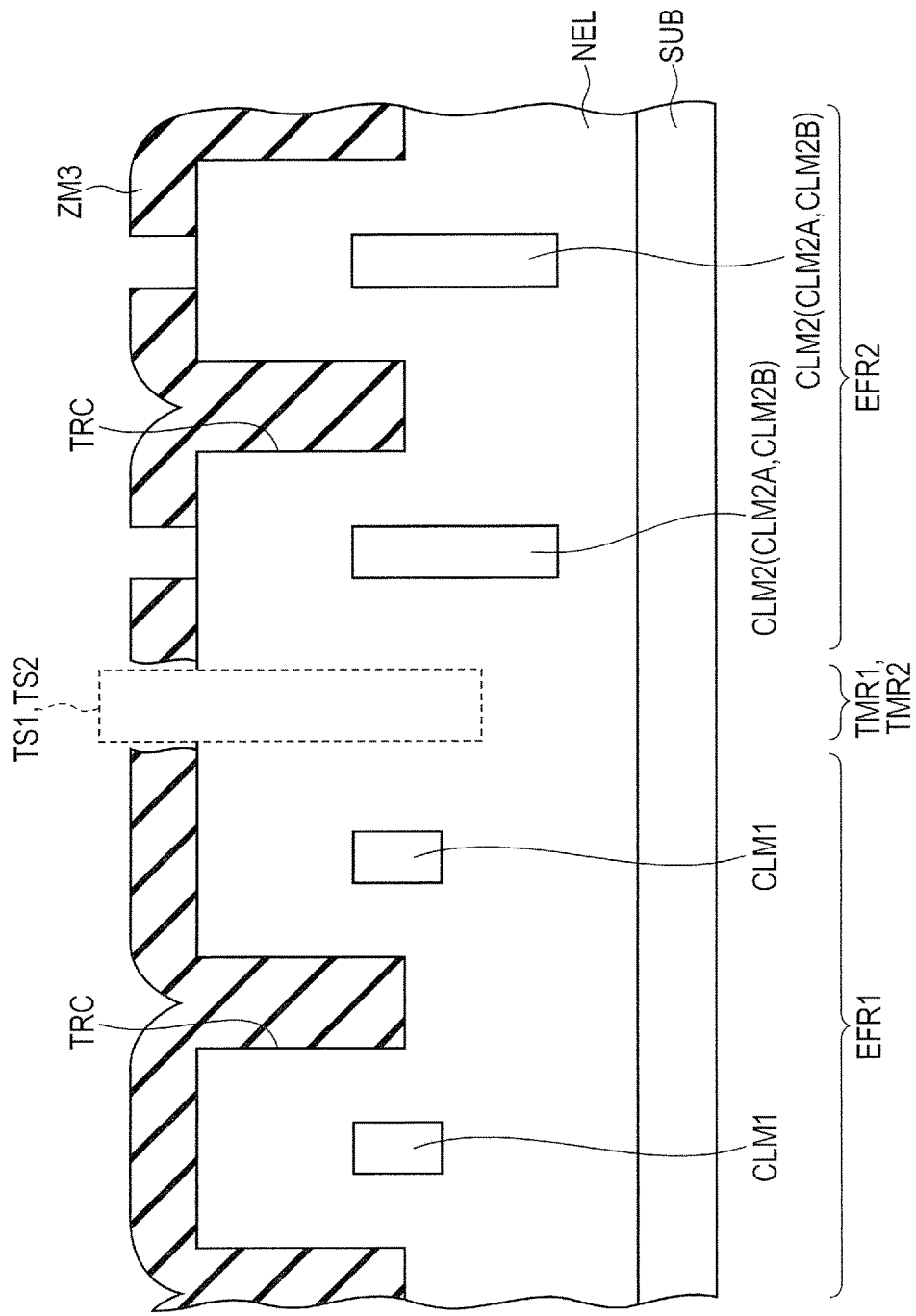
FIG. 26 is a partial cross-sectional view showing a step performed after the step of FIG. 25 according to the second embodiment.

Subsequently, an insulating film (not shown), e.g., a silicon oxide film serving as a mask member is formed over the epitaxial layer NEL. The insulating film is then subjected to photoengraving and etching so as to form an insulating film ZM3 that has openings for exposing column portions in the second element formation region EFR2 as shown in FIG. 26.

Figure 27:
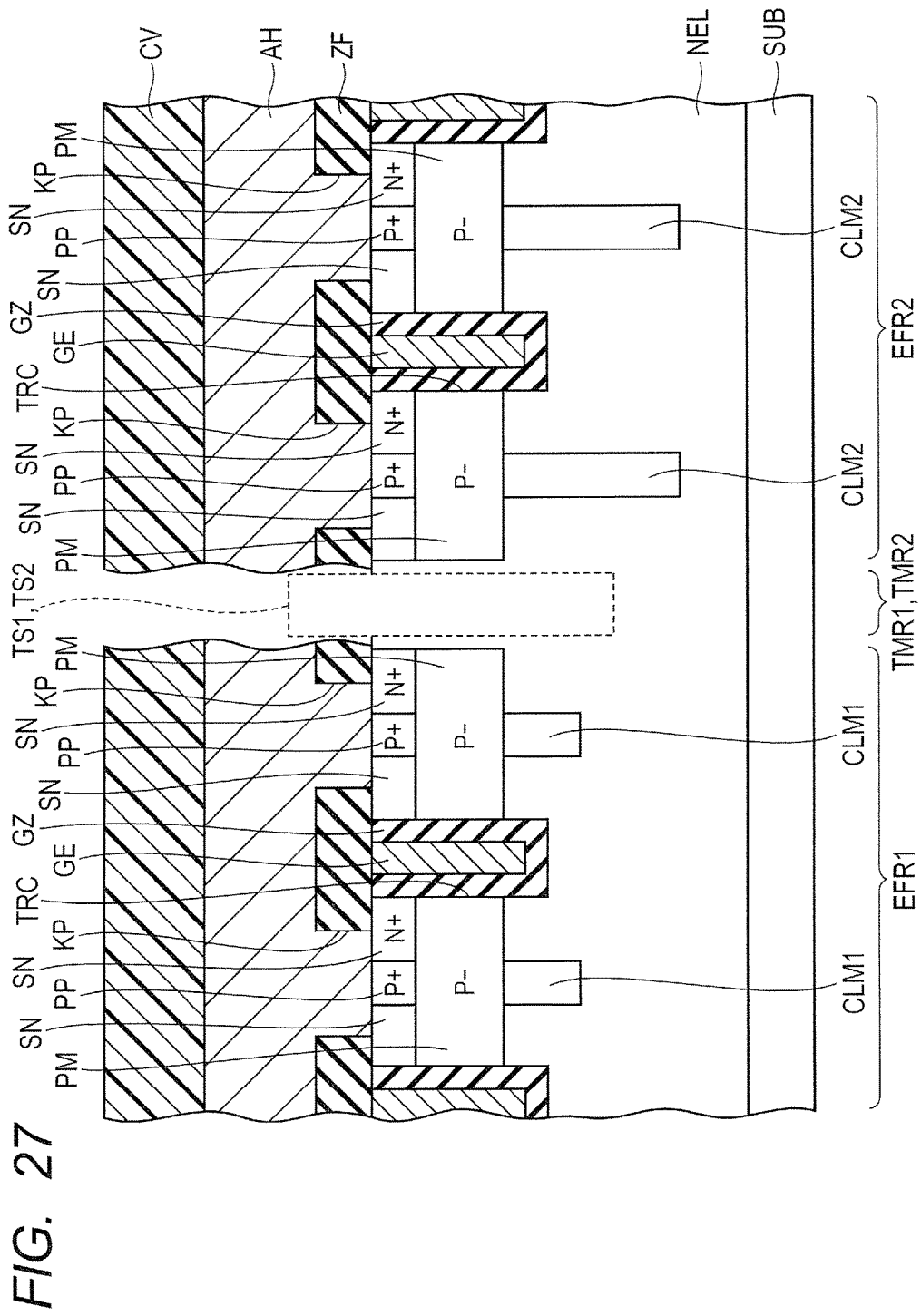
FIG. 27 is a partial cross-sectional view showing a step performed after the step of FIG. 26 according to the second embodiment.

After that, a P-type impurity is injected (Injection D) so as to be higher in injection energy than in injection C with the insulating film ZM3 serving as an injection mask, forming P-type second-column second portions CLM2B that extend toward the semiconductor substrate SUB so as to be coupled to the second-column first portions CLM2A in the second element formation region EFR2. The second-column first portion CLM2A (Injection C) and the second-column second portion CLM2B (Injection D) include the second column CLM2. The insulating film ZM3 is then removed. The semiconductor device is completed as shown in FIG. 27 through the same steps as those of FIGS. 7 to 13.

The operations of the semiconductor device will be simply described below. In appropriate coupling of the 24-V battery, power is supplied from the battery BA to the load LAD when the first power MOS transistor Q1 and the second power MOS transistor Q2 are turned on. When the second power MOS transistor Q2 is turned off, a withstand voltage is kept by the second power MOS transistor Q2 having a withstand voltage of about 60 V, thereby preventing a current from passing through a circuit (FIG. 1).

Subsequently, when the first power MOS transistor Q1 is turned off in reverse coupling of the 24-V battery, a current passes through a parasitic diode PDD2 so as to increase the potential of a common drain D12 regardless of the state (on or off) of the second power MOS transistor Q2. At this point, the first power MOS transistor Q1 having the first columns CLM1 keeps the withstand voltage, thereby preventing backflow of current to the circuit.

Thus, the semiconductor device acting as a switch can prevent a current from passing through the circuit both in appropriate coupling of the 24-V battery BA to the semiconductor device and reverse coupling of the 24-V battery BA to the semiconductor device.

In the semiconductor device, the first columns CLM1 formed in the first element formation region EFR1 are shorter than the second columns CLM2 formed in the second element formation region EFR2. As compared with the semiconductor device according to the comparative example in which the columns CLM1 formed in the first element formation region EFR1 are identical in length to the columns CLM2 formed in the second element formation region EFR2, the first columns CLM1 shorter than the second columns CLM2 facilitate passage of current, thereby increasing the amount of current.

Thus, the semiconductor device according to the present embodiment can reliably prevent backflow of current in reverse coupling of the 24-V battery BA and reduce an on resistance in appropriate coupling of the 24-V battery BA. As in the semiconductor device according to the first embodiment, this configuration can contribute to cost and size reduction of the semiconductor device as compared with the semiconductor device according to the comparative example.

(Modification)

As in the first embodiment, this modification will describe an example of a semiconductor device where a first power MOS transistor Q1 and a second power MOS transistor Q1 have P− regions PM at different depths.

Figure 28:
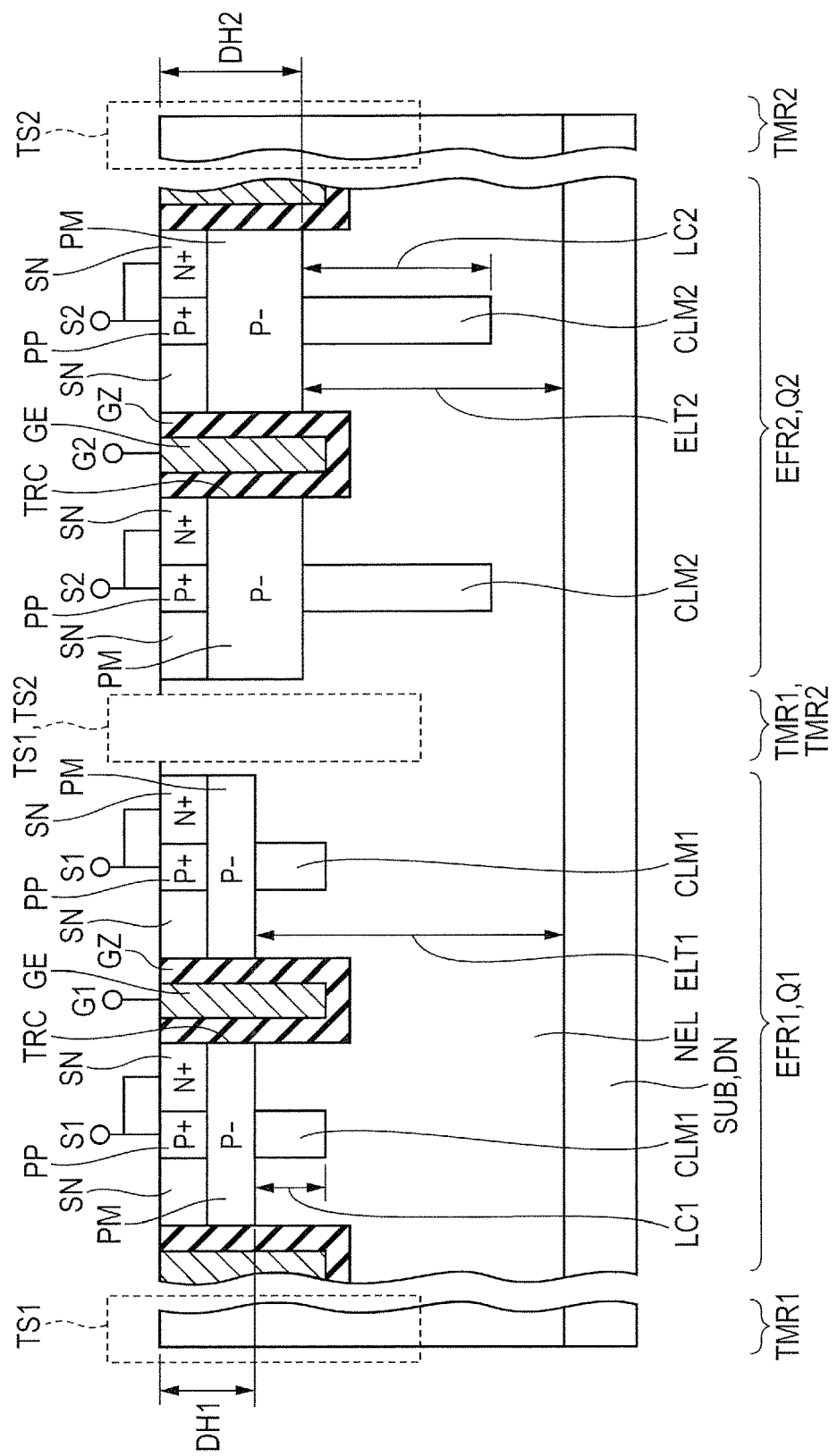
FIG. 28 is a partial cross-sectional view showing a semiconductor device according to a modification of the second embodiment.

As shown in FIG. 28, in the semiconductor device according to the modification, the P− region PM of a first element formation region EFR1 (first power MOS transistor Q1) has a depth DH1 smaller than a depth DH2 of the P− region PM of a second element formation region EFR2 (second power MOS transistor Q2) and the P− region PM of the first element formation region EFR1 is substantially smaller in thickness than the P− region PM of the second element formation region EFR2. Other configurations are identical to those of the semiconductor device shown in FIG. 24 and thus the same members are indicated by the same reference numerals and will not be repeatedly discussed unless otherwise necessary.

As in the modification of the first embodiment, the semiconductor device according to the modification can be manufactured by injection that forms the P− region PM in two steps (injection A and injection B).

In the semiconductor device according to the modification, the P− region PM of the first element formation region EFR1 is substantially smaller in thickness than the P− region PM of the second element formation region EFR2, thereby further reducing the on resistance of the first power MOS transistor Q1. This configuration can contribute to a reduction in the on resistance of the semiconductor device acting as a switch.

Third Embodiment

A semiconductor device used for a 48-V battery will be described below. The semiconductor device includes two power MOS transistors having SJ structures.

Figure 29:
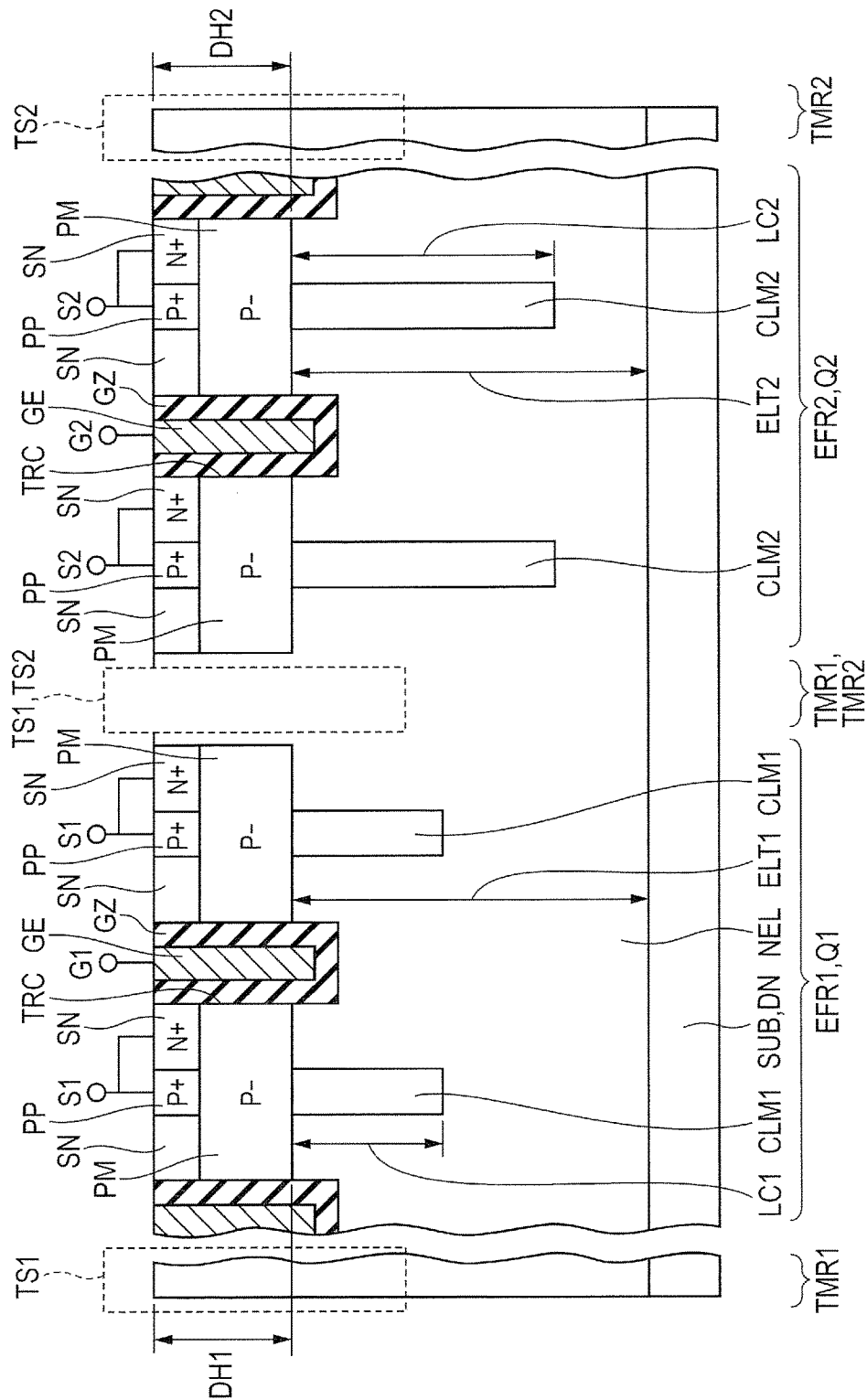
FIG. 29 is a partial cross-sectional view showing a semiconductor device according to a third embodiment.

As shown in FIG. 29, in a second element formation region EFR2 having a second power MOS transistor Q2, second columns CLM2 are formed in contact with a P− region PM so as to extend toward a semiconductor substrate SUB. The second column CLM2 has a length LC2 of, for example, about 3.5 μm.

In a first element formation region EFR1 having a first power MOS transistor Q1, first columns CLM1 are formed in contact with the P− region PM so as to extend toward the semiconductor substrate SUB. The first column CLM1 has a length LC1 shorter than the length LC2 of the second column CLM2.

An epitaxial layer NEL in the first element formation region EFR1 has a thickness ELT1 of, for example, about 4 μm that is equal to a thickness ELT2 of the epitaxial layer NEL in the second element formation region EFR2. The P− region PM of the first element formation region EFR1 has a depth DH1 that is equal to a depth DH2 of the P− region PM of the second element formation region EFR2. The planar structure of the semiconductor device is substantially identical to that of FIG. 23. Other configurations are identical to those of the semiconductor device shown in FIGS. 2 and 3 and thus the same members are indicated by the same reference numerals and will not be repeatedly discussed unless otherwise necessary.

If the battery has a voltage of 48 V, the power MOS transistor needs to have a withstand voltage of about 100 V in view of a load dump surge. In the case of reverse coupling of the battery, the withstand voltage of the power MOS transistor (48 V+several voltages) only needs to be slightly higher than the voltage of the battery in order to prevent backflow of current. In the semiconductor device, a withstand voltage of about 100 V is obtained by the second power MOS transistor Q2 having the SJ structure with the relatively long columns, whereas a withstand voltage slightly higher than the voltage of the battery is obtained by the first power MOS transistor Q1 having the SJ structure with the relatively short columns.

Figure 30:
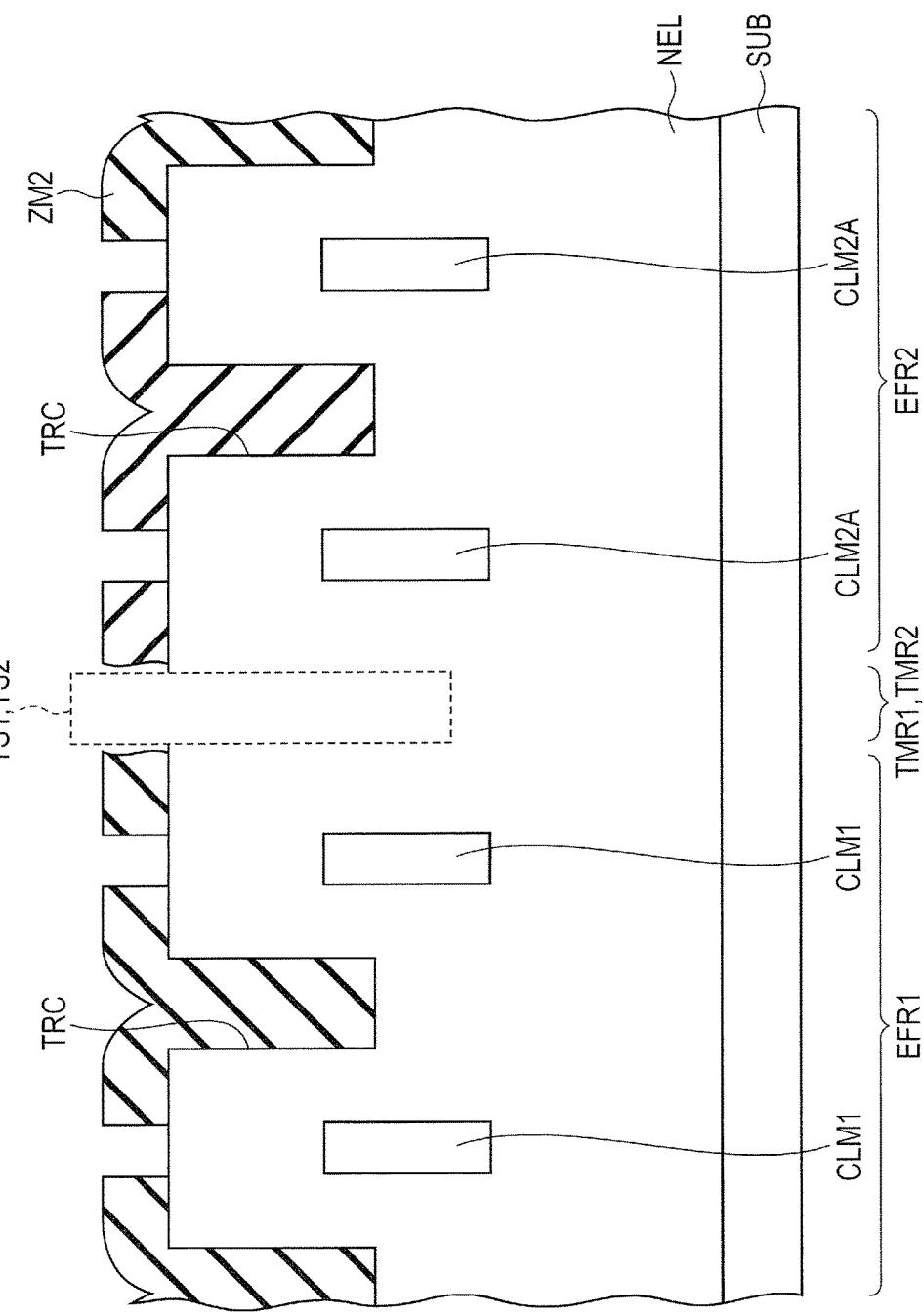
FIG. 30 is a partial cross-sectional view showing one step of the manufacturing method of the semiconductor device according to the third embodiment.

An example of a method of manufacturing the semiconductor device will be described below. First, after the same step as that of FIG. 5, an insulating film (not shown), e.g., a silicon oxide film serving as a mask member is formed over the epitaxial layer NEL. The insulating film is then subjected to photoengraving and etching so as to form an insulating film ZM2 that has openings for exposing column portions in the first element formation region EFR1 and opening for exposing column portions in the second element formation region EFR2 as shown in FIG. 30.

Subsequently, a P-type impurity is injected (Injection E) with the insulating film ZM2 serving as an injection mask, forming the P-type first columns CLM1 that extend toward the semiconductor substrate SUB. In the second element formation region EFR2, P-type second-column first portions CLM2A are formed so as to extend toward the semiconductor substrate SUB. The insulating film ZM2 is then removed.

Figure 31:
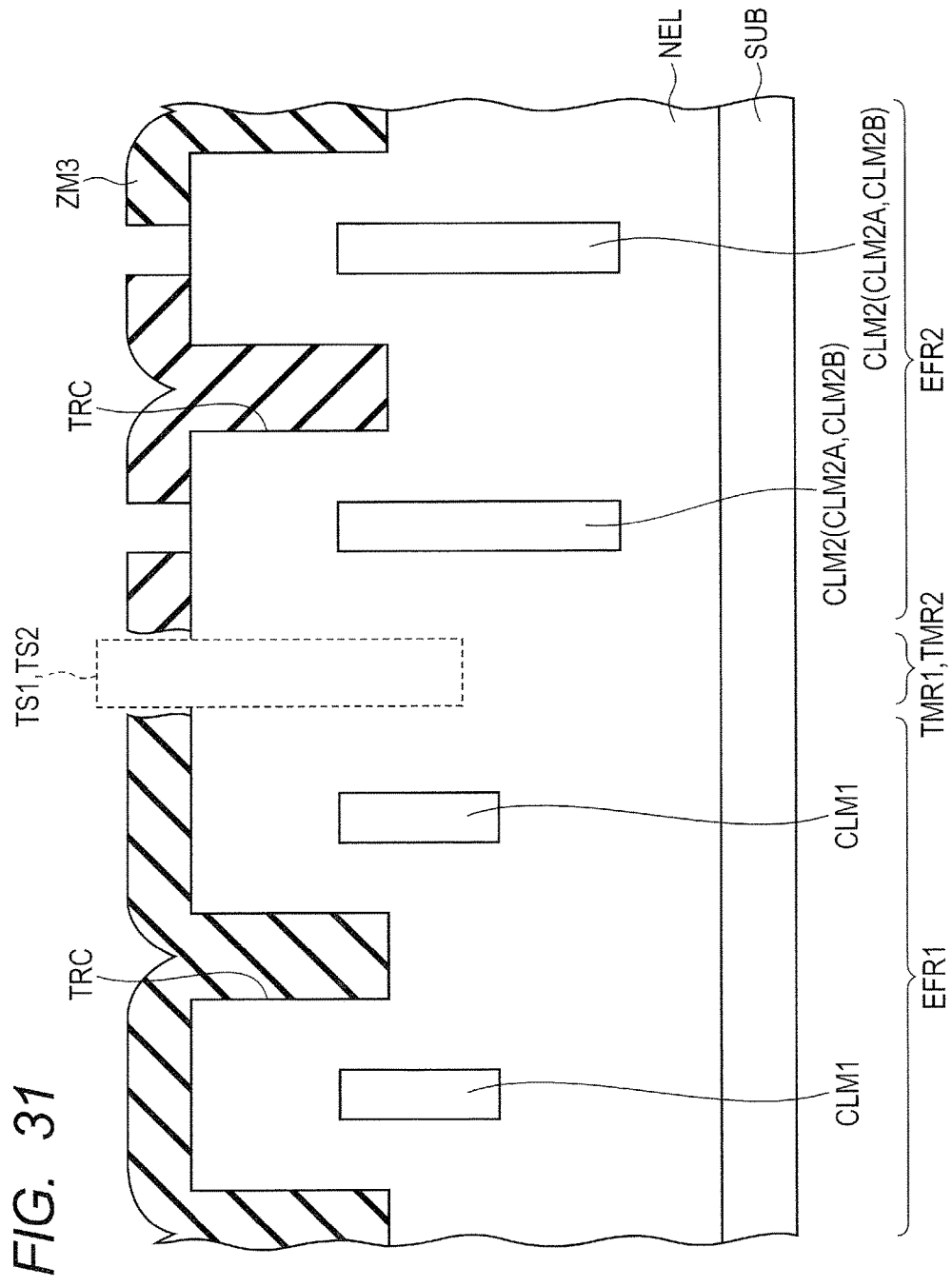
FIG. 31 is a partial cross-sectional view showing a step performed after the step of FIG. 30 according to the third embodiment.

Subsequently, an insulating film (not shown), e.g., a silicon oxide film serving as a mask member is formed over the epitaxial layer NEL. The insulating film is then subjected to photoengraving and etching so as to form an insulating film ZM3 that has openings for exposing column portions in the second element formation region EFR2 as shown in FIG. 31.

Figure 32:
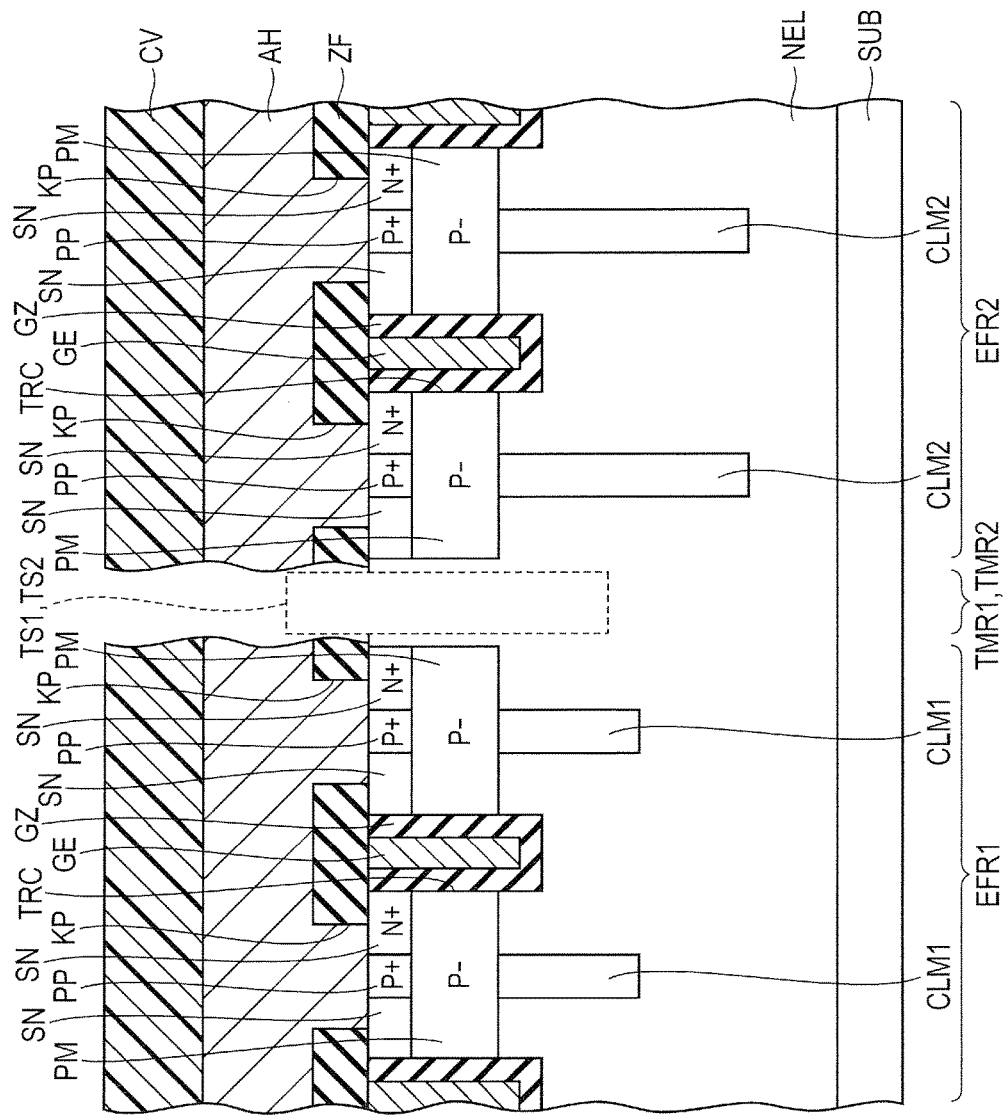
FIG. 32 is a partial cross-sectional view showing a step performed after the step of FIG. 31 according to the third embodiment.

After that, a P-type impurity is injected (Injection F) so as to be higher in injection energy than in injection E with the insulating film ZM3 serving as an injection mask, forming P-type second-column second portions CLM2B that extend toward the semiconductor substrate SUB so as to be coupled to the second-column first portions CLM2A in the second element formation region EFR2. The second-column first portion CLM2A (Injection E) and the second-column second portion CLM2B (Injection F) include the second column CLM2. The insulating film ZM3 is then removed. The semiconductor device is completed as shown in FIG. 32 through the same steps as those of FIGS. 7 to 13.

The operations of the semiconductor device will be simply described below. In appropriate coupling of the 48-V battery, power is supplied from a battery BA to a load LAD when the first power MOS transistor Q1 and the second power MOS transistor Q2 are turned on. When the second power MOS transistor Q2 is turned off, a withstand voltage is kept by the second power MOS transistor Q2 having a withstand voltage of about 100 V, thereby preventing a current from passing through a circuit (FIG. 1).

Subsequently, when the first power MOS transistor Q1 is turned off in reverse coupling of the 48-V battery, a current passes through a parasitic diode PDD2 so as to increase the potential of a common drain D12 regardless of the state (on or off) of the second power MOS transistor Q2. At this point, the first power MOS transistor Q1 having the first columns CLM1 keeps the withstand voltage, thereby preventing backflow of current to the circuit.

Thus, the semiconductor device acting as a switch can prevent a current from passing through the circuit both in appropriate coupling of the 48-V battery BA to the semiconductor device and reverse coupling of the 48-V battery BA to the semiconductor device.

In the semiconductor device, the first columns CLM1 formed in the first element formation region EFR1 are shorter than the second columns CLM2 formed in the second element formation region EFR2. As compared with the semiconductor device according to the comparative example in which the columns CLM1 formed in the first element formation region EFR1 are identical in length to the columns CLM2 formed in the second element formation region EFR2, the first columns CLM1 shorter than the second columns CLM2 facilitate passage of current, thereby increasing the amount of current.

Thus, the semiconductor device according to the present embodiment can reliably prevent backflow of current in reverse coupling of the 48-V battery BA and reduce an on resistance in appropriate coupling of the 48-V battery BA. As in the semiconductor device according to the first embodiment, this configuration can contribute to cost and size reduction of the semiconductor device as compared with the semiconductor device according to the comparative example.

(Modification)

As in the first embodiment, this modification will describe an example of a semiconductor device where a first power MOS transistor Q1 and a second power MOS transistor Q1 have P− regions PM at different depths.

Figure 33:
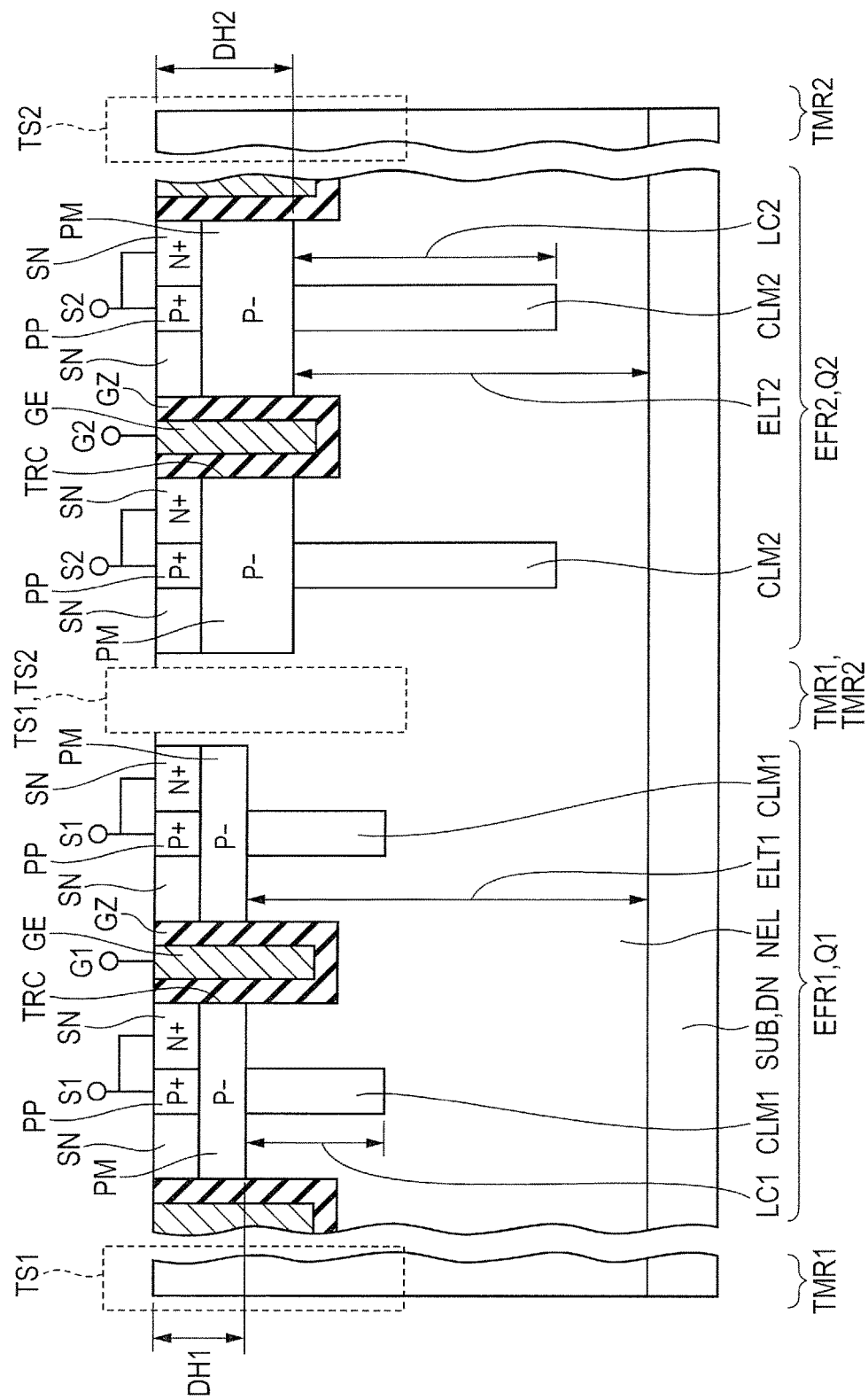
FIG. 33 is a partial cross-sectional view showing a semiconductor device according to a modification of the third embodiment.

As shown in FIG. 33, in the semiconductor device according to the modification, the P− region PM of a first element formation region EFR1 (first power MOS transistor Q1) has a depth DH1 smaller than a depth DH2 of the P− region PM of a second element formation region EFR2 (second power MOS transistor Q2) and the P− region PM of the first element formation region EFR1 is substantially smaller in thickness than the P− region PM of the second element formation region EFR2. Other configurations are identical to those of the semiconductor device shown in FIG. 24 and thus the same members are indicated by the same reference numerals and will not be repeatedly discussed unless otherwise necessary.

As in the modification of the first embodiment, the semiconductor device according to the modification can be manufactured by injection that forms the P− region PM in two steps (injection A and injection B).

In the semiconductor device according to the modification, the P− region PM of the first element formation region EFR1 is substantially smaller in thickness than the P− region PM of the second element formation region EFR2, thereby further reducing the on resistance of the first power MOS transistor Q1. This configuration can contribute to a reduction in the on resistance of the semiconductor device acting as a switch.

The foregoing embodiments described examples in which the columns CLM, the first column CLM1, and the second columns CLM2 are formed by injecting P-type impurity. The method of forming the columns CLM and other columns is not limited to the ion injection. For example, the openings may be formed on the epitaxial layer NEL by etching, and then the P-type epitaxial layer may be grown in the openings.

The columns circular in cross section may have any shapes such as a square and a strip as long as charge balance is kept. The first power MOS transistor Q1 and the second power MOS transistor Q2, which are n-channel power MOS transistors, may be p-channel power MOS transistors.

The semiconductor devices according to the foregoing embodiments may be optionally combined in various ways. Moreover, numerical values such as a thickness in the embodiments are merely exemplary and thus do not limit the present invention.

The inventions made by the inventors were specifically described according to the embodiments. The present invention is not limited to the embodiments and may be changed in various ways without departing from the scope of the invention.

The first to third embodiments include the following aspects:

(Note 1)

A circuit arrangement including:
a first switching element including a first gate electrode, a first drain, and a first source; and
a second switching element including a second gate electrode, a second drain, and a second source,
the first and second switching elements being coupled in series over a semiconductor substrate with the first and second drains serving as common drains,
the first switching element having a first super-junction structure including first columns on a current path,
the second switching element having a second super-junction structure including second columns along the current path,
the first column being shorter than the second column.

(Note 2)

A circuit arrangement according to Note 1 includes:
a battery having a cathode and an anode, the cathode being electrically coupled to the first source, the anode being electrically coupled to the second source, and
a load electrically coupled between the anode of the battery and the second source.

(Note 3)

A method of manufacturing a semiconductor device includes the steps of:
growing an epitaxial layer of a first conductivity type on the surface of a semiconductor substrate of the first conductivity type;
determining a first region and a second region located with a certain distance in the epitaxial layer;
forming a first trench on the epitaxial layer located in the first region and a second trench on the epitaxial layer located in the second region;
forming columns of a second conductivity type in the epitaxial layer located in the second region, the columns being extended from a position having a smaller depth than the bottom of the second trench toward the semiconductor substrate;
forming a first electrode in the first trench via a first insulating film, and a second electrode in the second trench via a second insulating film;
forming a first-impurity-region first part of the second conductivity type in the epitaxial layer located in the first region such that the first-impurity-region first part in contact with the first insulating film having a smaller depth than the bottom of the first trench;
forming a first-impurity-region second part of the second conductivity type in the epitaxial layer located in the second region such that the first-impurity-region second part in contact with the second insulating film and the columns has a smaller depth than the bottom of the second trench; and
forming a second-impurity-region first part of the first conductivity type in the epitaxial layer located in the first region such that the second-impurity-region first part in contact with the first-impurity-region first part has a smaller depth than the first-impurity-region first part, and a second-impurity-region second part of the first conductivity type in the epitaxial layer located in the second region such that the second-impurity-region second part in contact with the first-impurity-region second part has a smaller depth than the first-impurity-region second part.

(Note 4)

In the method of manufacturing the semiconductor device according to Note 3, the first-impurity-region first part has a smaller thickness than the first-impurity-region second part in the step of forming the first-impurity-region first part and the step of forming the first-impurity-region second part.

(Note 5)

In the method of manufacturing the semiconductor device according to Note 3 or 4, forming the columns includes the steps of:

forming a mask member having an opening pattern that exposes the surface of the epitaxial layer located in the second region; and introducing an impurity of the second conductivity type with the mask member serving as an introduction mask.

(Note 6)

A method of manufacturing a semiconductor device includes the steps of:

growing an epitaxial layer of a first conductivity type on the surface of a semiconductor substrate of the first conductivity type;

determining a first region and a second region located with a certain distance in the epitaxial layer;

forming a first trench the epitaxial layer located in the first region and a second trench on the epitaxial layer located in the second region;

forming columns including first columns of a second conductivity type and second columns of the second conductivity type, the first columns being located in the epitaxial layer in the first region so as to extend toward the semiconductor substrate from a depth smaller than that of the bottom of the first trench, the second columns being located in the epitaxial layer in the second region so as to extend deeper than the first columns from a depth smaller than that of the bottom of the second trench;

forming a first electrode in the first trench via a first insulating film, and a second electrode in the second trench via a second insulating film;

forming a first-impurity-region first part of the second conductivity type in the epitaxial layer located in the first region such that the first-impurity-region first part in contact with the first insulating film has a smaller depth than the bottom of the first trench;

forming a first-impurity-region second part of the second conductivity type in the epitaxial layer located in the second region such that the first-impurity-region second part in contact with the second insulating film and the second columns has a smaller depth than the bottom of the second trench; and forming a second-impurity-region first part of the first conductivity type in the epitaxial layer located in the first region such that the second-impurity-region first part in contact with the first-impurity-region first part has a smaller depth than the first-impurity-region first part, and a second-impurity-region second part of the first conductivity type in the epitaxial layer located in the second region such that the second-impurity-region second part in contact with the first-impurity-region second part has a smaller depth than the first-impurity-region second part.

(Note 7)

In the method of manufacturing the semiconductor device according to Note 6, the first-impurity-region first part has a smaller thickness than the first-impurity-region second part in the step of forming the first-impurity-region first part and the step of forming the first-impurity-region second part.

(Note 8)

In the method of manufacturing the semiconductor device according to Note 6 or 7, forming the columns includes the steps of:

forming a first mask member having a first opening pattern that exposes the surface of a first part of the epitaxial layer located in the first region and the surface of a second part of the epitaxial layer located in the second region;

forming the first columns in the first region and a second-column first part in the second region by introducing an impurity of the second conductivity type with the first mask member serving as an introduction mask;

forming a second mask member with a second opening pattern that covers the first region and exposes the surface of the second part of the epitaxial layer located in the second region; and forming the second columns using a second-column second part formed by introducing an impurity of the second conductivity type with the second mask member serving as an introduction mask, the second-column second part being deeper than the second-column first part so as to be coupled to the second-column first part.

What is claimed is:

1. A semiconductor device comprising:
a semiconductor substrate of a first conductivity type;
an epitaxial layer of the first conductivity type in contact with a surface of the semiconductor substrate;
first and second regions determined with a certain distance in the epitaxial layer;
a first switching element that is formed in the first region and is electrically coupled to the semiconductor substrate;
a second switching element that is formed in the second region and is electrically coupled to the semiconductor substrate so as to be coupled in series to the first switching element,
the first switching element including:
a first electrode formed in a first trench via a first insulating film, the first trench being formed over the epitaxial layer;
a first-impurity-region first part of the second conductivity type in the epitaxial layer, the first-impurity-region first part being formed with a first thickness in contact with the first insulating film at a smaller depth than a bottom of the first trench; and
a second-impurity-region first part of the first conductivity type in the epitaxial layer, the second-impurity-region first part being formed in contact with the first-impurity-region first part at a smaller depth than the first-impurity-region first part,
the second switching element including:
a second electrode formed in a second trench via a second insulating film, the second trench being formed over the epitaxial layer;
a first-impurity-region second part of the second conductivity type in the epitaxial layer, the first-impurity-region second part being formed with a second thickness in contact with the second insulating film at a smaller depth than a bottom of the second trench;
a second-impurity-region second part of the first conductivity type in the epitaxial layer, the second-impurity-region second part being formed in contact with the first-impurity-region second part at a smaller depth than the first-impurity-region second part; and
columns of the second conductivity type, the columns being extended from the first-impurity-region second part toward the semiconductor substrate and away from both the second insulating film and the second electrode.

2. The semiconductor device according to claim 1, wherein the first thickness of the first-impurity-region first part is smaller than the second thickness of the first-impurity-region second part.

3. A circuit arrangement using the semiconductor device according to claim 2 as a switch, the circuit arrangement comprising:
- a battery having a cathode and an anode, the cathode being electrically coupled to the second-impurity-region first part, the anode being electrically coupled to the second-impurity-region second part; and
- a load electrically coupled between the anode of the battery and the switch.

4. The semiconductor device according to claim 1, wherein the second trench is formed in one direction, and the columns are spaced at certain intervals in the one direction.

5. A circuit arrangement using the semiconductor device according to claim 4 as a switch, the circuit arrangement comprising:
- a battery having a cathode and an anode, the cathode being electrically coupled to the second-impurity-region first part, the anode being electrically coupled to the second-impurity-region second part; and
- a load electrically coupled between the anode of the battery and the switch.

6. A circuit arrangement using the semiconductor device according to claim 1 as a switch, the circuit arrangement comprising:
- a battery having a cathode and an anode, the cathode being electrically coupled to the second-impurity-region first part, the anode being electrically coupled to the second-impurity-region second part; and
- a load electrically coupled between the anode of the battery and the switch.

7. The semiconductor device according to claim 1, wherein in a direction perpendicular to the direction in which the columns are extended, the columns are within the second switching element and spaced apart from each of the second trench, the second electrode and the second insulating film.

8. The semiconductor device according to claim 1, wherein a withstand voltage of the second switching element is greater than a withstand voltage of the first switching element.

9. The semiconductor device according to claim 8, wherein the withstand voltage of the second switching element is greater than twice the withstand voltage of the first switching element.

* * * * *